US010002857B2

(12) United States Patent
Solimando et al.

(10) Patent No.: US 10,002,857 B2
(45) Date of Patent: Jun. 19, 2018

(54) PACKAGE ON PACKAGE (POP) DEVICE COMPRISING THERMAL INTERFACE MATERIAL (TIM) IN CAVITY OF AN ENCAPSULATION LAYER

(71) Applicant: QUALCOMM Incorporated, San Diego, CA (US)

(72) Inventors: Michael James Solimando, San Diego, CA (US); William Stone, San Diego, CA (US); John Holmes, San Diego, CA (US); Christopher Healy, San Diego, CA (US); Rajendra Pendse, San Diego, CA (US); Sun Yun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/225,910

(22) Filed: Aug. 2, 2016

(65) Prior Publication Data

US 2017/0294422 A1    Oct. 12, 2017

Related U.S. Application Data

(60) Provisional application No. 62/321,609, filed on Apr. 12, 2016.

(51) Int. Cl.
| | |
|---|---|
| *H01L 23/367* | (2006.01) |
| *H01L 23/02* | (2006.01) |
| *H01L 25/065* | (2006.01) |
| *H01L 21/54* | (2006.01) |

(Continued)

(52) U.S. Cl.
CPC ........ *H01L 25/105* (2013.01); *H01L 21/4882* (2013.01); *H01L 21/54* (2013.01);
(Continued)

(58) Field of Classification Search
CPC ... H01L 25/50; H01L 25/105; H01L 25/0652; H01L 25/0657; H01L 23/367; H01L 23/3128; H01L 23/3672; H01L 23/49827; H01L 21/54; H01L 21/563; H01L 21/4882
USPC ....... 257/686, 693, 698, 703, 738, 774, 788, 257/798, E23.002, E23.004, E23.01, 257/E23.052, E25.013, E25.023, E21.499,
(Continued)

(56) References Cited

U.S. PATENT DOCUMENTS

| | | | | |
|---|---|---|---|---|
| 5,641,997 A | * | 6/1997 | Ohta ....................... | C08L 63/00 257/788 |
| 7,329,706 B2 | * | 2/2008 | Fukui ..................... | C08L 83/04 524/588 |

(Continued)

*Primary Examiner* — Dao H Nguyen
(74) *Attorney, Agent, or Firm* — Loza & Loza, LLP/Qualcomm

(57) ABSTRACT

A package on package (PoP) device includes a first package, a thermal interface material, and a second package coupled to the first package. The first package includes a first integrated device and a first encapsulation layer that at least partially encapsulates the first integrated device, where the first encapsulation layer includes a first cavity located laterally with respect to the first integrated device. The thermal interface material (TIM) is coupled to the first integrated device such that the thermal interface material (TIM) is formed between the first integrated device and the second package. The thermal interface material (TIM) is formed in the first cavity of the first encapsulation layer.

34 Claims, 19 Drawing Sheets

(51) Int. Cl.
*H01L 25/10* (2006.01)
*H01L 25/00* (2006.01)
*H01L 23/31* (2006.01)
*H01L 21/56* (2006.01)
*H01L 21/48* (2006.01)
*H01L 23/498* (2006.01)

(52) U.S. Cl.
CPC ........ *H01L 21/563* (2013.01); *H01L 23/3128* (2013.01); *H01L 23/367* (2013.01); *H01L 23/3672* (2013.01); *H01L 23/49827* (2013.01); *H01L 25/0652* (2013.01); *H01L 25/0657* (2013.01); *H01L 25/50* (2013.01); *H01L 2225/1058* (2013.01); *H01L 2225/1094* (2013.01)

(58) Field of Classification Search
USPC .......... 257/E21.502, E21.511; 438/107, 108, 438/109, 122, 124; 524/404, 588
See application file for complete search history.

(56) References Cited

U.S. PATENT DOCUMENTS

| | | | |
|---|---|---|---|
| 8,039,316 B2 | 10/2011 | Chi et al. | |
| 8,050,047 B2 | 11/2011 | Chow et al. | |
| 9,136,202 B2 | 9/2015 | Chiriac et al. | |
| 9,502,342 B2* | 11/2016 | Kim | H01L 24/97 |
| 2004/0061212 A1* | 4/2004 | Karnezos | H01L 23/3128 |
| | | | 257/686 |
| 2005/0017347 A1* | 1/2005 | Morimoto | H05K 1/186 |
| | | | 257/703 |
| 2010/0113667 A1* | 5/2010 | Morita | C08L 83/04 |
| | | | 524/404 |
| 2011/0133325 A1* | 6/2011 | Moon | H01L 23/3128 |
| | | | 257/686 |
| 2015/0206869 A1 | 7/2015 | Kim et al. | |
| 2015/0235935 A1* | 8/2015 | Lin | H01L 23/49827 |
| | | | 257/693 |
| 2015/0348865 A1 | 12/2015 | Vincent et al. | |
| 2016/0276308 A1* | 9/2016 | Min | H01L 23/367 |

* cited by examiner

PACKAGE ON PACKAGE (POP) DEVICE COMPRISING THERMAL INTERFACE MATERIAL (TIM) IN CAVITY OF AN ENCAPSULATION LAYER

CROSS-REFERENCE/CLAIM OF PRIORITY TO RELATED APPLICATION

The present application claims priority to U.S. Provisional Application No. 62/321,609 titled "PACKAGE ON PACKAGE (PoP) DEVICE COMPRISING THERMAL INTERFACE MATERIAL (TIM) IN CAVITY OF AN ENCAPSULATION LAYER", filed Apr. 12, 2016, which is hereby expressly incorporated by reference herein.

BACKGROUND

Field of the Disclosure

Various features relate generally to a package on package (PoP) device, and more specifically to a package-on-package (PoP) device that includes a thermal interface material (TIM) in a cavity of an encapsulation layer.

Background

FIG. 1 illustrates a package on package (PoP) device 100 that includes a first package 102 and a second package 104. The first package 102 includes a first die 120, a first package substrate 122, and a first encapsulation layer 150. The first package substrate 122 includes a first plurality of pads 124 and a first pad 126. The first die 120 is coupled to the first package substrate 122 through a first plurality of solder balls 128. Specifically, the first die 120 is coupled to the first plurality of pads 124 through the first plurality of solder balls 128. A second plurality of solder balls 136 is coupled to the first package substrate 122.

The second package 104 includes a second die 140, a second package substrate 142, a second pad 146, a third plurality of solder balls 156, and a second encapsulation layer 160. The second die 140 is coupled to the second package substrate 142. The second package 104 is coupled to the first package 102 through the third plurality of solder balls 156. For example, the third plurality solder balls 156 is coupled to the first pad 126 of the first package substrate 122, and the second pad 146 of the second package 104.

The first encapsulation layer 150 has a low thermal conductivity value and thus is a poor conductor of heat. The first encapsulation layer 150 encapsulates the first die 120, which means heat generated by the first die 120 does not dissipate very well. This in turn can result in the overheating of the first die 120.

Therefore, there is an ongoing need for better heat dissipating of integrated devices and/or packages.

SUMMARY

Various features relate generally to a package on package (PoP) device, and more specifically to a package-on-package (PoP) device that includes a thermal interface material (TIM) in a cavity of an encapsulation layer.

One example provides a package on package (PoP) device that includes a first package, a thermal interface material (TIM), and a second package coupled to the first package. The first package includes a first integrated device and a first encapsulation layer that at least partially encapsulates the first integrated device. The first encapsulation layer includes a first cavity located laterally with respect to the first integrated device. The thermal interface material (TIM) is coupled to the first integrated device such that the thermal interface material (TIM) is formed between the first integrated device and the second package. The thermal interface material (TIM) is formed in the first cavity of the first encapsulation layer.

Another example provides a package on package (PoP) device that includes a first package, a thermal interface material (TIM), and a second package coupled to the first package. The first package includes a first integrated device and a first encapsulation layer that at least partially encapsulates the first integrated device. The first encapsulation layer includes a first cavity over the first integrated device. The thermal interface material (TIM) is coupled to the first integrated device such that the thermal interface material (TIM) is formed between the first integrated device and the second package. The thermal interface material (TIM) is formed in the first cavity of the first encapsulation layer.

DRAWINGS

Various features, nature and advantages may become apparent from the detailed description set forth below when taken in conjunction with the drawings in which like reference characters identify correspondingly throughout.

DETAILED DESCRIPTION

Figure 1:
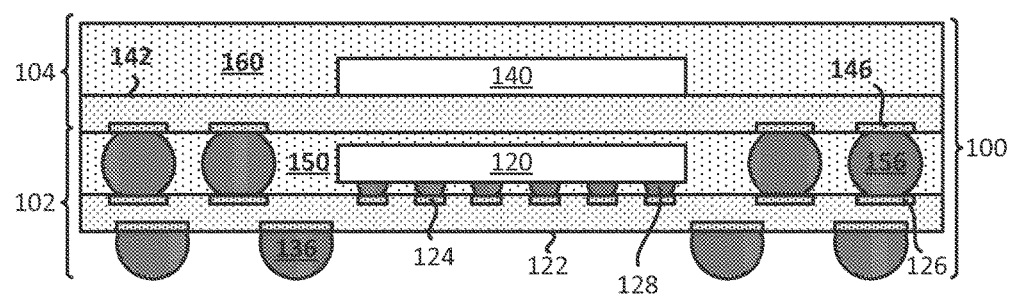
FIG. 1 illustrates a profile view of a package on package (PoP) device.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Some features pertain to a package on package (PoP) device that includes a first package, a thermal interface material (TIM), and a second package coupled to the first package. The first package includes a first integrated device and a first encapsulation layer that at least partially encapsulates the first integrated device. The first encapsulation layer includes a first cavity located laterally with respect to the first integrated device. The thermal interface material (TIM) is coupled to the first integrated device such that the thermal interface material (TIM) is formed between the first integrated device and the second package. The thermal interface material (TIM) is formed in the first cavity of the first encapsulation layer.

In some implementations, the height of the package may be defined along the Z-direction of the package, which is shown in the figures of the present disclosure. In some implementations, the Z-direction of the package may be defined along an axis between a top portion and a bottom portion of the package. The terms top and bottom may be arbitrarily assigned, however as an example, the top portion of the package may be a portion comprising an encapsulation layer, while a bottom portion of the package may be a portion comprising a redistribution portion or a plurality of solder balls. In some implementations, the top portion of the package may be a back side of the package, and the bottom portion of the package may be a front side of the package. The front side of the package may be an active side of the package. A top portion may be a higher portion relative to a lower portion. A bottom portion may be a lower portion relative to a higher portion. Further examples of top portions and bottom portions will be further described below. The X-Y directions of the package may refer to the lateral direction and/or footprint of the package. Examples of X-Y directions are shown in the figures of the present disclosure and/or further described below. In many of the figures of the present disclosure, the packages and their respective components are shown across a X-Z cross-section or X-Z plane. However, in some implementations, the packages and their representative components may be represented across a Y-Z cross-section or Y-Z plane.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., data signal, ground signal, power signal). An interconnect may be part of a circuit. An interconnect may include more than one element or component.

Exemplary Package on Package (PoP) Device Comprising a Thermal Interface Material (TIM)

Figure 2:
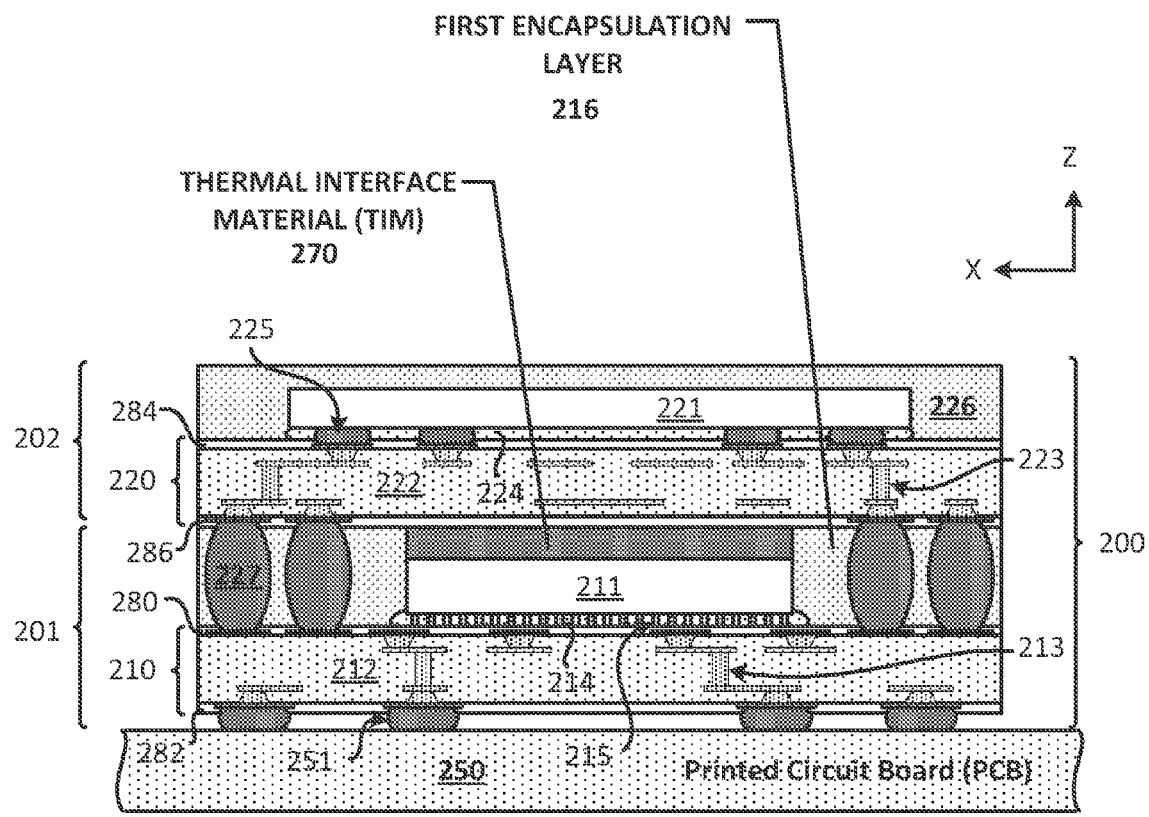
FIG. 2 illustrates a profile view of a package on package (PoP) device that includes a thermal interface material (TIM).

FIG. 2 illustrates a package on package (PoP) device 200 that includes a first package 201, a second package 202, and a thermal interface material (TIM) 270. The second package 202 is coupled to the first package 201. The first package 201 may be a first integrated circuit (IC) package, and the second package 202 may be a second integrated circuit (IC) package. The package on package (PoP) device 200 is coupled to a printed circuit board (PCB) 250 through a plurality of solder balls 251.

As shown in FIG. 2, the thermal interface material (TIM) 270 is located between the first package 201 and the second package 202. In some implementations, the thermal interface material (TIM) 270 is located between an electronic package component (e.g., first die 211) of the first package 201 and the second package 202.

As will be further described below, in some implementations, the thermal interface material (TIM) 270 is configured to dissipate heat away from one or more dies (e.g., first die 211). The thermal interface material (TIM) 270 has a higher thermal conductivity value than the thermal conductivity value of the first encapsulation layer 216. In some implementations, the thermal conductivity value of the thermal interface material (TIM) 270 is about 1.0 W/mk or higher (e.g., 1.4 W/mk or higher). However, different implementations may use a thermal interface material (TIM) with different thermal conductivity values.

The first package 201 includes a first package substrate 210, a first die 211, a first underfill 214, a plurality of first interconnects 215, a first encapsulation layer 216, and the thermal interface material (TIM) 270. In some implementations, the first package 201 may also include a plurality of package interconnects 227. The first die 211 is an example of an electronic package component.

The first package substrate 210 includes at least one dielectric layer 212, a plurality of first interconnects 213 (e.g., plurality of first substrate interconnects), a first solder resist layer 280 and a second solder resist layer 282. The plurality of first interconnects 213 may include traces, vias and/or pads. The first package substrate 210 is coupled to the printed circuit board (PCB) 250 through the plurality of solder balls 251. More specifically, the plurality of first interconnects 213 is coupled to the plurality of solder balls 251.

The first die 211 may be an integrated circuit (IC) that includes a plurality of transistors and/or other electronic components. The first die 211 may be a logic die and/or a memory die. The first die 211 may be a bare die. The first die 211 is coupled to the first package substrate 210 through the plurality of first interconnects 215. The first underfill 214 is located between the first die 211 and the first package substrate 210. The first underfill 214 may at least partially surround at least some of the plurality of first interconnects 215.

The first encapsulation layer 216 at least partially encapsulates the first die 211, the thermal interface material (TIM) 270, and the plurality of package interconnects 227. Different implementations may use different materials for the first encapsulation layer 216. For example, the first encapsulation layer 216 may include a mold and/or an epoxy fill.

The second package 202 includes a second package substrate 220, a second die 221, a second underfill 224, a plurality of second solder balls 225, and a second encapsulation layer 226. In some implementations, the second package 202 may also include the plurality of package interconnects 227.

The second package substrate 220 includes at least one dielectric layer 222, a plurality of second interconnects 223 (e.g., plurality of second substrate interconnects), a first solder resist layer 284 and a second solder resist layer 286. The plurality of second interconnects 223 may include traces, vias and/or pads.

The second die 221 may be an integrated circuit (IC) that includes a plurality of transistors and/or other electronic components. The second die 221 may be a logic die and/or a memory die. The second die 221 may be a bare die. The second die 221 is coupled to the second package substrate 220 through the plurality of second solder balls 225. The second underfill 224 is located between the second die 221 and the second package substrate 220. The second underfill 224 may at least partially surround at least some of the plurality of second solder balls 225. The second encapsulation layer 226 at least partially encapsulates the second die 221. Different implementations may use different materials for the second encapsulation layer 226. For example, the second encapsulation layer 226 may include a mold and/or an epoxy fill.

The second package 202 is coupled to the first package 201 through the plurality of package interconnects 227. The plurality of package interconnects 227 may include a solder interconnect (e.g., solder ball). The plurality of package interconnects 227 is coupled to the first package substrate 210 and the second package substrate 220. More specifically, the plurality of package interconnects 227 is coupled to the plurality of first interconnects 213 (of the first package substrate 210) and the plurality of second interconnects 223 (of the second package substrate 220).

The present disclosure illustrates and describes interconnects (e.g., 215, 225) being used to couple the dies (e.g., 211, 221) to the package substrates (e.g., 210, 220). These interconnects may be pillars and/or solder interconnects, or combination thereof. In some implementations, other interconnects may be used to couple the dies to the package substrates. For examples, some implementations may use wire bonding to couple dies to the package substrate.

The thermal interface material (TIM) 270 may be a means for heat dissipation. As shown in FIG. 2, the thermal interface material (TIM) 270 is located over the first die 211 (e.g., over a back side surface of the first die 211). In particular, the thermal interface material (TIM) 270 is located between the first die 211 and the second package substrate 220 of the second package 202. The thermal interface material (TIM) 270 is coupled to the first die 211.

One of the technical challenges with the thermal interface material (TIM) is controlling the amount and flow of the thermal interface material (TIM). Prior to a curing process (e.g., reflow process) the thermal interface material (TIM) may flow like a liquid or semi-liquid. Thus, when the thermal interface material (TIM) is disposed on the die (e.g., the first die 211) it is important to be able to control where the thermal interface material (TIM) is placed in the package.

In some implementations, it is very desirable to have a thermal interface material (TIM) that flows fairly easily so that the thermal interface material (TIM) can flow easily and properly between packages (e.g., between a die and a substrate). This is because filling all the space (or as much space as possible) between packages with a material (other than air) provides a stronger and more robust package and/or package on package (PoP). The additional structural support by the thermal interface material (TIM) results in less warpage of the package and/or package on package (PoP) device, which in turn provides a more reliable device. In some implementations, when the thermal interface material (TIM) is formed between packages, the warpage of the package or the package on package (PoP) device may be about 25 microns (μm) or less (e.g., when the thermal interface material (TIM) has a thickness of about 50 microns (μm).

In addition, air acts as an insulator. Therefore, if the thermal interface material (TIM) is not able to easily flow in gaps and/or small space (e.g., leaving air gaps), then the package won't dissipate heat as well. Thus, there is a big technical advantage in using a thermal interface material (TIM) that has a relatively low viscosity. By forming a thermal interface material (TIM) in the gaps and small space, there is improved heat dissipation in the package, which leads to lower maximum die temperature (e.g., lower maximum temperature of the first die 211) and/or lower overall temperature of the package.

However, the downside of using a thermal interface material (TIM) that flows very easily is controlling it in the package and/or package on package (PoP) device before a curing process (e.g., reflow process). A thermal interface material (TIM) that flows too easily may flow into other parts of the package and can cause problems (e.g., causes electrical shortages), resulting in a defective package. Thus, controlling the position and/or flow of a thermal interface material (TIM) that has low viscosity (e.g., viscosity of about 23,000 millipascal seconds (mPa·s) or less, at 5 revolutions per minute (RPM)) is important. It is noted that different implementations may use a thermal interface material (TIM) with different viscosity values. In some implementations, the thermal interface material (TIM) has a low viscosity value and a thermal conductivity value of about 1.0 W/mk or higher (e.g., 1.4 W/mk or higher).

One way of achieving thermal interface material (TIM) control is to create one or more cavities in the encapsulation layer of the package (e.g., in the first encapsulation layer 216). As shown in FIG. 2, one or more cavities can be formed in the encapsulation layer over the die, which creates a restricted space with boundaries, over the die where the thermal interface material (TIM) can be disposed.

Another way of achieving control of the thermal interface material (TIM) is to create one or more cavities in the encapsulation layer that are configured as boundaries to catch overflow thermal interface material (TIM). In such an instance, no cavity is needed to be formed over the die (although a cavity could still be formed in the encapsulation layer over the die). Instead, one or more cavities are formed in the encapsulation layer such that the one or more cavities are located laterally with respect to the die (e.g., first die 211) in the encapsulation layer.

Using the above approaches, individually or collectively, a technical solution is provided that addresses the challenges of providing a controlled thermal interface material (TIM) with low viscosity (e.g., flows easily) in a package and/or a package on package (PoP) device. Various examples of forming cavities in the encapsulation layer will now be described below.

Figure 3:
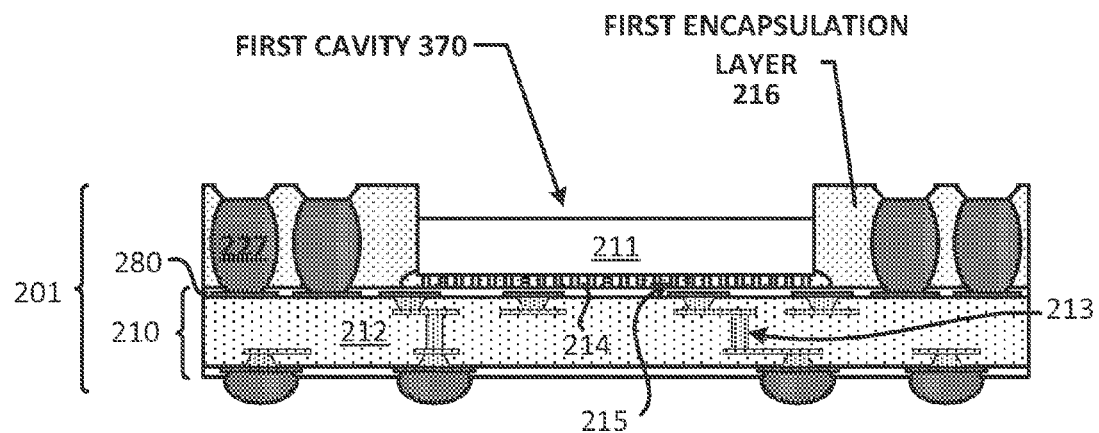
FIG. 3 illustrates a profile view of a package that includes a cavity in an encapsulation layer of the package.

FIG. 3 illustrates the first package 201 prior to having the thermal interface material (TIM) 270. As shown in FIG. 3, a cavity 370 is formed in the first encapsulation layer 216, such that the cavity 370 is formed over the first die 211. Different implementations may form the cavities differently. In some implementations, a laser process (e.g., laser ablation) and/or an etching process (e.g., photo-etching process) may be used to form the cavity 370.

Figure 4:
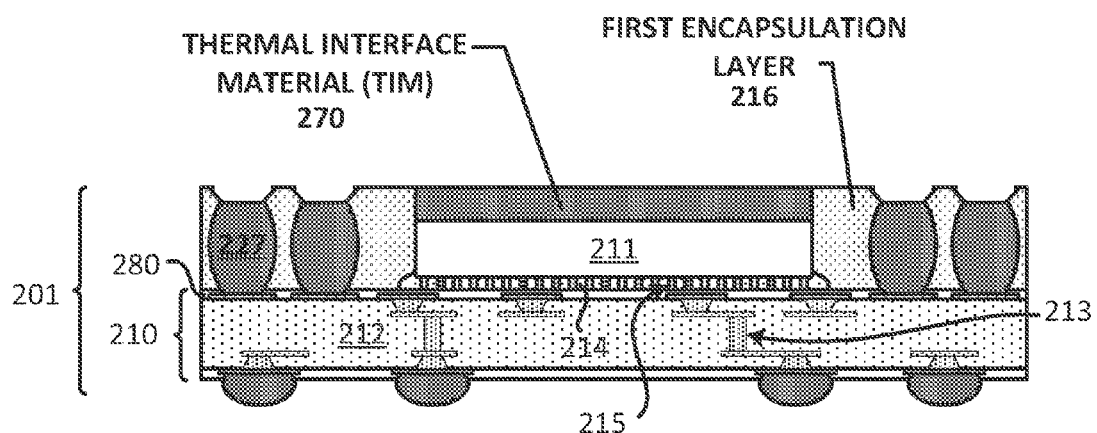
FIG. 4 illustrates a profile view of a package includes a thermal interface material (TIM) in an encapsulation layer.

FIG. 4 illustrates the first package 201 with the thermal interface material (TIM) 270. As shown in FIG. 4, the thermal interface material (TIM) 270 is formed in the cavity 370 of the first encapsulation layer 216. FIG. 4 also illustrates that the thermal interface material (TIM) 270 is formed in the cavity 370 such that the thermal interface material (TIM) 270 is coupled to the first die 211 and is formed over the first die 211. This configuration where the thermal interface material (TIM) 270 is formed over the first die 211 allows heat to more efficiently dissipate away from first die 211.

Exemplary Package on Package (PoP) Devices Comprising a Thermal Interface Material (TIM)

Different implementations may include different configurations and/or combinations of the package on package (PoP) devices that includes a thermal interface material (TIM). Below are further examples of different package on package (PoP) devices that include a thermal interface material (TIM).

Figure 5:
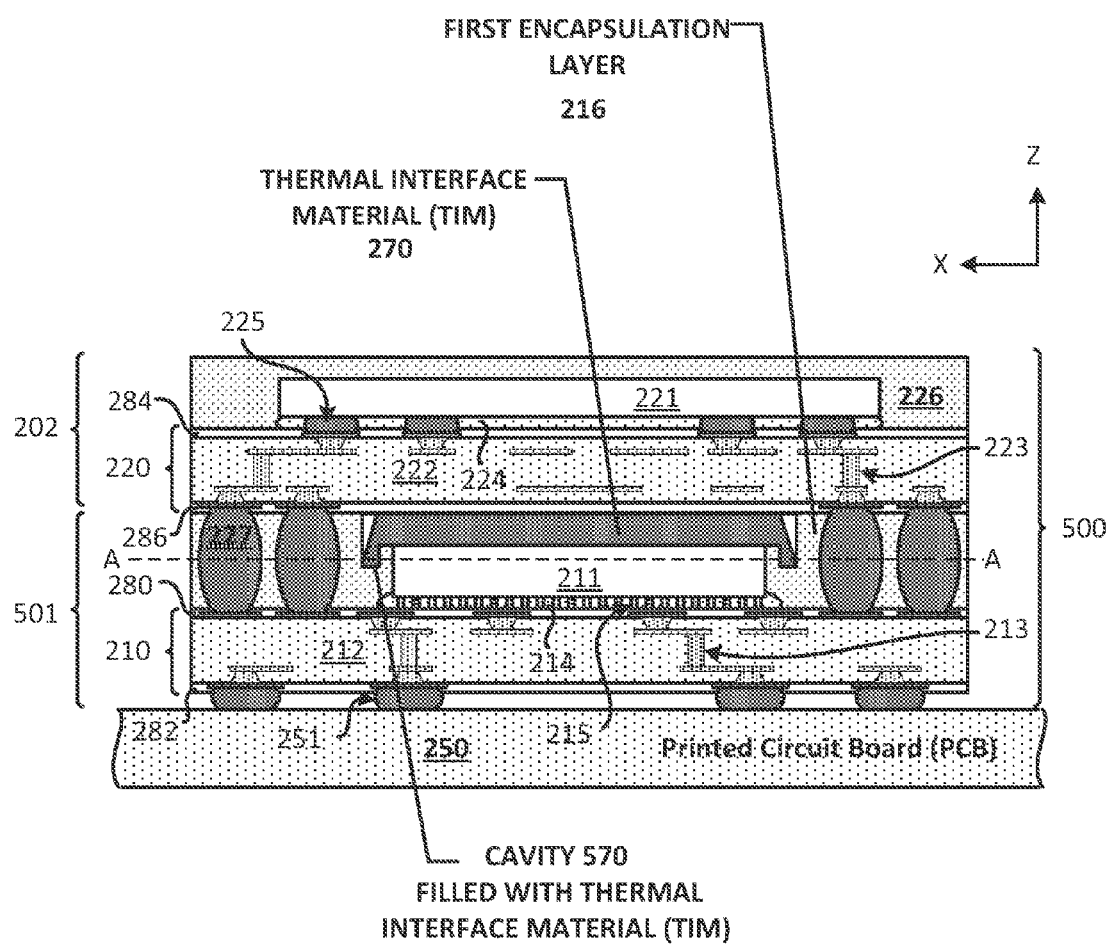
FIG. 5 illustrates a profile view of a package on package (PoP) device that includes a thermal interface material (TIM).

FIG. 5 illustrates another package on package (PoP) device 500 that includes a first package 501, the second package 202, and the thermal interface material (TIM) 270. The second package 202 is coupled to the first package 501. The first package 501 may be a first integrated circuit (IC) package. The package on package (PoP) device 500 is coupled to a printed circuit board (PCB) 250 through the plurality of solder balls 251. The package on package (PoP) device 500 is similar to the package on package (PoP) device 200, except that the first package 501 has a different configuration.

More specifically, the first package 501 includes a cavity 570 that is formed in the first encapsulation layer 216 such that the cavity 570 is formed over the first die 211 and also laterally around the first die 211. As shown in FIG. 5, the thermal interface material (TIM) 270 is formed in the cavity 570.

It is noted that the cavity 570 may include one or more cavities formed in the first encapsulation layer 216. For example, the cavity 570 may include a first cavity located above the first die 211, and a second cavity located laterally with respect to the first die 211 (e.g., located laterally around the first die 211 in the first encapsulation layer 216). The cavity 570 may be a contiguous cavity or may include a plurality of cavities. Examples of the different cavities are described and illustrated below in at least FIGS. 15 and 16.

In some implementations, during the fabrication process of the package, the thermal interface material (TIM) 270 may move and flow around. In some implementations, it is possible that the thermal interface material (TIM) 270 may flow into the plurality of package interconnects 227, which can cause a defective interconnection. In some implementations, the cavity 570 that is located laterally around (e.g., at least partially laterally around) the first die 211 is configured to act as a trench to catch overflow thermal interface material (TIM) (e.g., thermal interface material (TIM) 270) provided above the first die 211.

Figure 6:
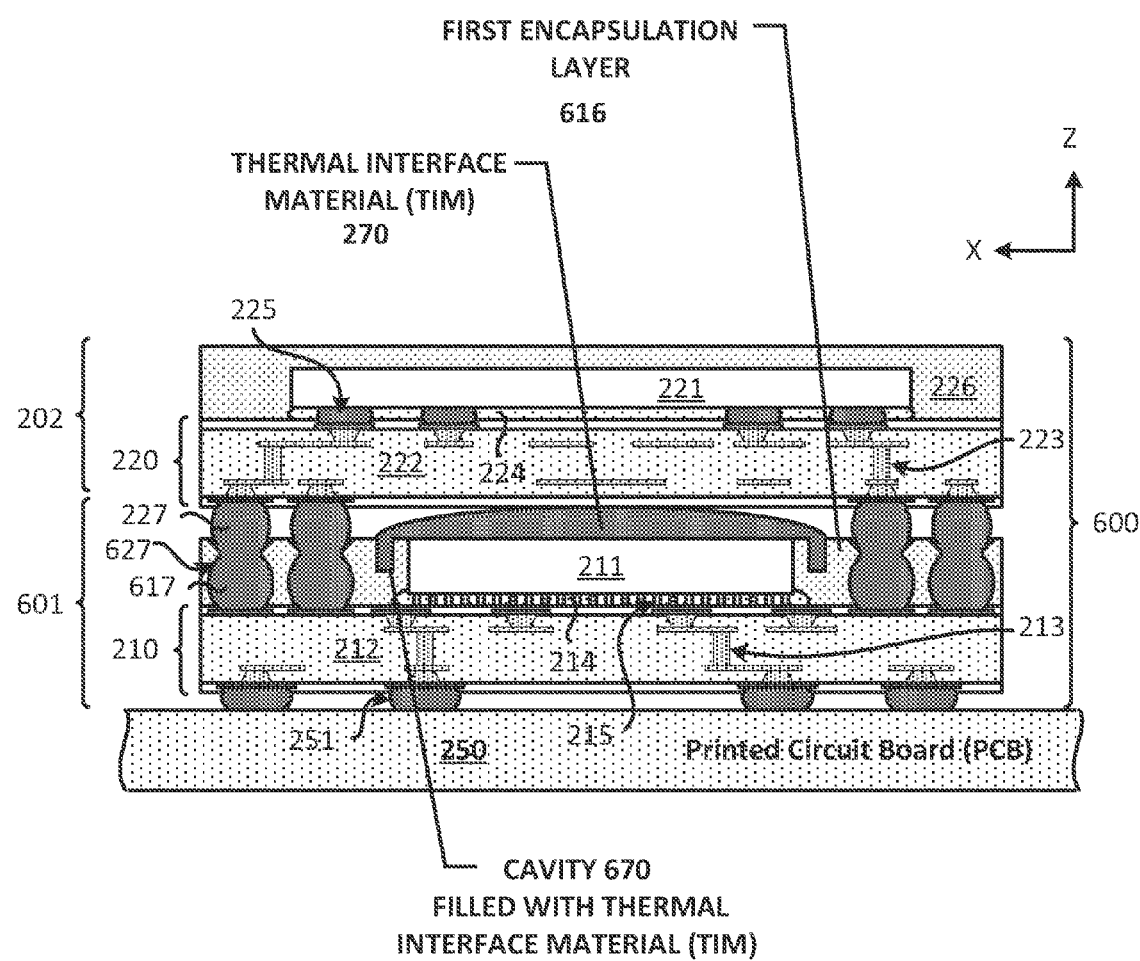
FIG. 6 illustrates a profile view of a package on package (PoP) device that includes a thermal interface material (TIM).

FIG. 6 illustrates another package on package (PoP) device 600 that includes a first package 601, the second package 202, and the thermal interface material (TIM) 270. The second package 202 is coupled to the first package 601. The first package 601 may be a first integrated circuit (IC) package. The package on package (PoP) device 600 is coupled to a printed circuit board (PCB) 250 through the plurality of solder balls 251. The package on package (PoP) device 600 is similar to the package on package (PoP) device 200, except that the first package 601 has a different configuration.

More specifically, the first package 601 includes a cavity 670 that is formed in the first encapsulation layer 216 such that the cavity 670 is formed laterally around the first die 211. In addition, a surface of the first encapsulation layer 216 is substantially aligned or substantially co-planar with a surface (e.g., back side surface, non-active side) of the first die 211. As shown in FIG. 6, the thermal interface material (TIM) 270 is formed over the first die 211 and in the cavity 670. In some implementations, the cavity 670 is configured to capture overflow thermal interface material (TIM) 270 that may flow during the fabrication process (e.g., reflow process) of the package on package (PoP) device 600.

The first package 601 and the second package 202 may be coupled together through a plurality of package interconnects 627. The plurality of package interconnects 627 may include a plurality of package interconnects 617 (e.g., solder balls) and the plurality of package interconnects 227 (e.g., solder balls).

Figure 7:
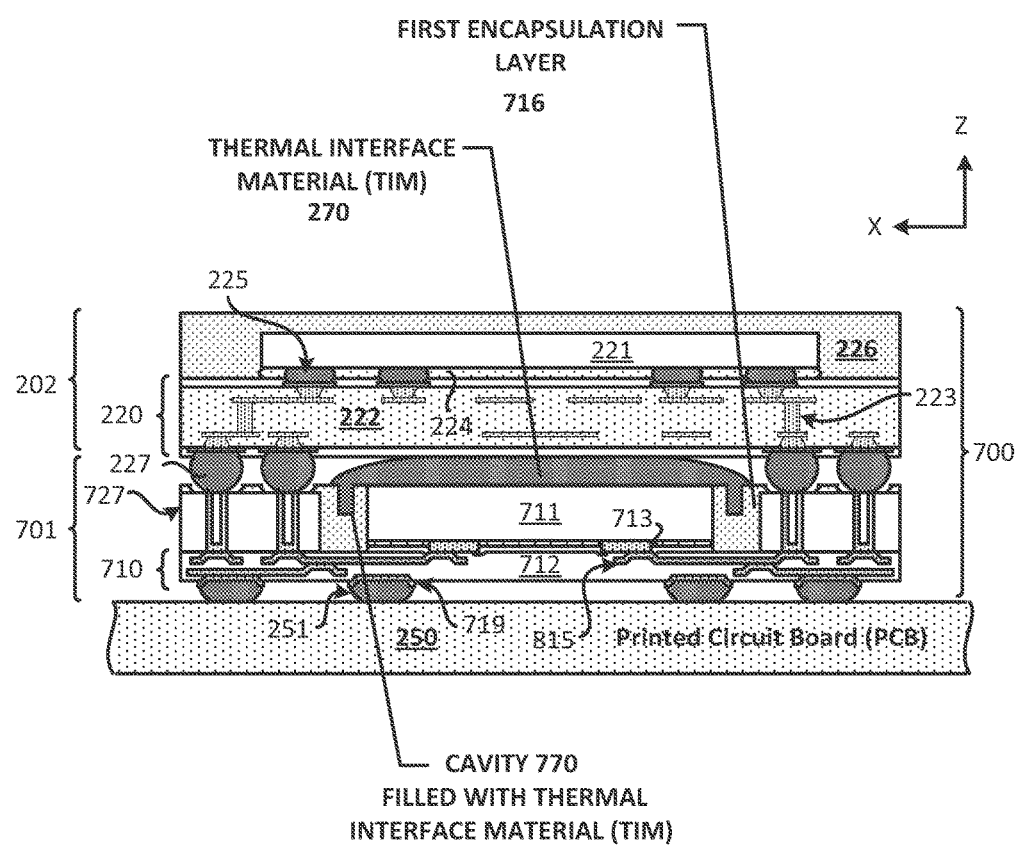
FIG. 7 illustrates a profile view of a package on package (PoP) device that includes a thermal interface material (TIM).

FIG. 7 illustrates another package on package (PoP) device 700 that includes a first package 701, the second package 202, and the thermal interface material (TIM) 270. The second package 202 is coupled to the first package 701. The package on package (PoP) device 800 is coupled to a printed circuit board (PCB) 250 through the plurality of solder balls 251. The package on package (PoP) device 700 is similar to the package on package (PoP) device 200, except that the first package 701 has a different configuration. In particular, the first package 701 includes a wafer level package (WLP).

The first package 701 may include a fan out wafer level package (FOWLP). The first package 701 includes a first redistribution portion 710, a first die 711, a first encapsulation layer 216, and the first encapsulation layer 716. The first redistribution portion 710 may be a fan out portion (e.g. for fanning or routing of signaling to and from devices with different I/O pitches).

The first package 701 includes a cavity 770 that is formed in the first encapsulation layer 716 such that the cavity is formed laterally around the first die 711. As shown in FIG. 7, thermal interface material (TIM) 770 is formed in the cavity 770.

It is noted that the cavity 770 may include one or more cavities formed in the first encapsulation layer 716. For example, the cavity 770 may include a first cavity located over the first die 711, and a second cavity located laterally around (e.g., at least laterally and partially around) the first die 711.

The first package 701 may also include the plurality of package interconnects 727. The plurality of package interconnects 727 may be printed circuit board (PCB) bar that includes a dielectric layer and interconnects. The plurality of package interconnects 727 may be coupled to the first redistribution portion 710 and the plurality of package interconnects 227. The plurality of package interconnects 227 may include a solder interconnect (e.g., solder ball).

The first redistribution portion 710 includes at least one dielectric layer 712, at least one redistribution layer 715, and at least one underbump metallization (UBM) layer 719. A redistribution layer (e.g. 715) may redistribute signaling from I/O pads of a die to other parts of the package. The at least one redistribution layer 715 is coupled to the at least one UBM layer 719. The at least one UBM layer 719 is coupled to the plurality of solder balls 251. In some implementations, the at least one UBM layer 719 may be optional. In such instances, the plurality of solder balls 251 may be coupled to the at least one redistribution layer 715.

The first die 711 may be an integrated circuit (IC) that includes a plurality of transistors and/or other electronic components. The first die 711 may be a logic die and/or a memory die. The first die 711 may be a bare die. The first die 711 may include the pad 713. The first die 711 is coupled to the first redistribution portion 710. In particular, the pad 713 of the first die 711 is coupled to the at least one redistribution layer 715.

The first encapsulation layer 716 at least partially encapsulates the first die 711 and the plurality of package interconnects 727 (e.g., PCB bar). In some implementations, a surface of the first encapsulation layer 716 may be substantially co-planar with a surface (e.g., back side surface) of the first die 711.

The second package 202 is coupled to the first package 701 through the plurality of package interconnects 727 and the plurality of package interconnects 227. The plurality of package interconnects 727 is coupled to the first redistribution portion 710. In particular, the plurality of package interconnects 727 is coupled to the at least one redistribution layer 715 (of the first redistribution portion 710). In some implementations, the plurality of package interconnects 227 is coupled to the plurality of second interconnects 223 and the plurality of package interconnects 727. The plurality of package interconnects 727 is coupled to the at least one redistribution layer 715 of the first redistribution portion 710.

Figure 8:
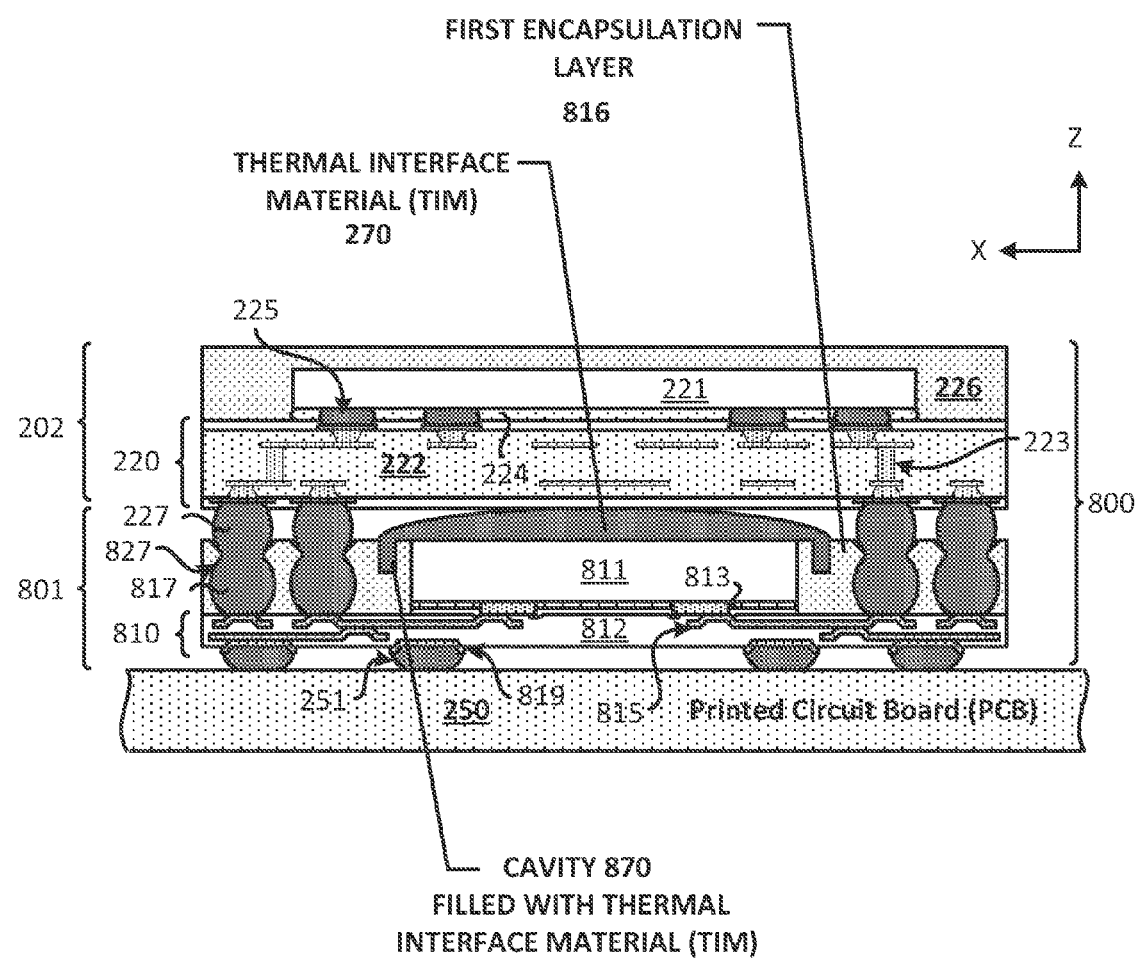
FIG. 8 illustrates a profile view of a package on package (PoP) device that includes a thermal interface material (TIM).

FIG. 8 illustrates another package on package (PoP) device 800 that includes a first package 801, the second package 202, and the thermal interface material (TIM) 270. The second package 202 is coupled to the first package 801. The package on package (PoP) device 800 is coupled to a printed circuit board (PCB) 250 through the plurality of solder balls 251. The package on package (PoP) device 800 is similar to the package on package (PoP) device 700, except that the first package 801 has a different configuration. In particular, the first package 801 includes a wafer level package (WLP).

In some implementations, the thermal interface material (TIM) 270 is located between the first package 801 and the second package 202. In some implementations, the thermal interface material (TIM) 270 is located between an electronic package component (e.g., first die 811) of the first package 801 and the second package 202.

The first package 801 includes a cavity 870 that is formed in the encapsulation layer 816 such that the cavity is formed laterally around the first die 811. As shown in FIG. 8, the thermal interface material (TIM) 270 is formed in the cavity 870. It is noted that the cavity 870 may include one or more cavities formed in the encapsulation layer 816. For example, the cavity 870 may include a first cavity located above the first die 811, and a second cavity located laterally around (e.g., located laterally and at least partially around) to the first die 811.

The first package 801 may include a fan out wafer level package (FOWLP). The first package 801 includes a first redistribution portion 810, a first die 811, a first encapsulation layer 216, and an encapsulation layer 816. The first redistribution portion 810 may be a fan out portion (e.g. for fanning or routing of signaling to and from devices with different I/O pitches). The first package 801 may also include the plurality of package interconnects 827. The plurality of package interconnects 827 may include a plurality of package interconnects 817 and the plurality of package interconnects 227. The plurality of package interconnects 827 may include a solder interconnect (e.g., solder ball).

The first redistribution portion 810 includes at least one dielectric layer 812, at least one redistribution layer 815, and at least one underbump metallization (UBM) layer 819. A redistribution layer (e.g. 815) may redistribute signaling from I/O pads of a die to other parts of the package. The at least one redistribution layer 815 is coupled to the at least one UBM layer 819. The at least one UBM layer 819 is coupled to the plurality of solder balls 251. In some implementations, the at least one UBM layer 819 may be optional. In such instances, the plurality of solder balls 251 may be coupled to the at least one redistribution layer 815.

The first die 811 may be an integrated circuit (IC) that includes a plurality of transistors and/or other electronic components. The first die 811 may be a logic die and/or a memory die. The first die 811 may be a bare die. The first die 811 may include the pad 813. The first die 811 is coupled to the first redistribution portion 810. In particular, the pad 813 of the first die 811 is coupled to the at least one redistribution layer 815.

The encapsulation layer 816 at least partially encapsulates the first die 811 and the plurality of package interconnects 827. For example, the encapsulation layer 816 may at least partially encapsulate the first die 811 and the plurality of package interconnects 817. In some implementations, a surface of the encapsulation layer 816 may be substantially co-planar with a surface (e.g., back side surface) of the first die 811.

The second package 202 is coupled to the first package 801 through the plurality of package interconnects 827, which includes the plurality of package interconnects 227 and the plurality of package interconnects 817. The plurality of package interconnects 827 may include a solder interconnect (e.g., solder ball). The plurality of package interconnects 827 is coupled to the first redistribution portion 810 and the second package substrate 220. In particular, the plurality of package interconnects 827 is coupled to the at least one redistribution layer 815 (of the first redistribution portion 810) and the plurality of second interconnects 223 (of the second package substrate 220). In some implementations, the plurality of package interconnects 227 is coupled to the plurality of second interconnects 223 and the plurality of package interconnects 817. The plurality of package interconnects 817 is coupled to the at least one redistribution layer 815 of the first redistribution portion 810.

Figure 9:
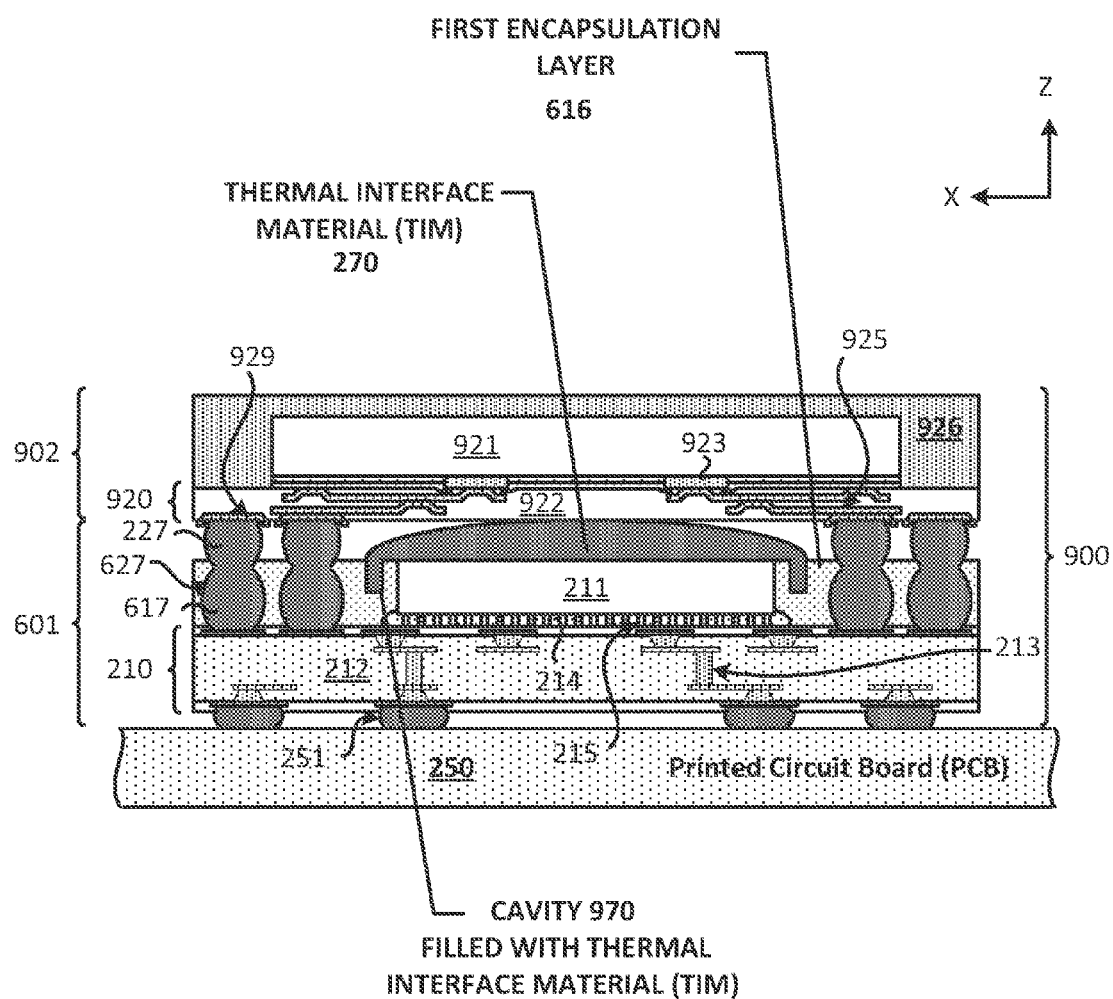
FIG. 9 illustrates a profile view of a package on package (PoP) device that includes a thermal interface material (TIM).

FIG. 9 illustrates another package on package (PoP) device 900 that includes the first package 601, a second package 902, and the thermal interface material (TIM) 270. The second package 902 is coupled to the first package 601. The first package 601 may be a first integrated circuit (IC) package. The package on package (PoP) device 900 is coupled to a printed circuit board (PCB) 250 through the plurality of solder balls 251. The package on package (PoP) device 900 is similar to the package on package (PoP) device 600 of FIG. 6, except that the second package 902 has a different configuration. In particular, the second package 902 includes a wafer level package (WLP).

In some implementations, the thermal interface material (TIM) 270 is located between the first package 701 and the second package 902. In some implementations, the thermal interface material (TIM) 270 is located between an electronic package component (e.g., first die 211) of the first package 701 and the second package 902.

The first package 701 includes a cavity 970 that is formed in the encapsulation layer 816 such that the cavity is formed laterally around the first die 211. As shown in FIG. 9, the thermal interface material (TIM) 270 is formed in the cavity 970. It is noted that the cavity 970 may include one or more cavities formed in the encapsulation layer 916. For example, the cavity 970 may include a first cavity located above the first die 211, and a second cavity located laterally around the first die 211.

The first package 701 includes the first package substrate 210, the first die 211, the first underfill 214, the plurality of first interconnects 215, the first encapsulation layer 216, the thermal interface material (TIM) 270, and the encapsulation layer 916. In some implementations, the first package 701 may also include the plurality of package interconnects 627. The plurality of package interconnects 627 may include the plurality of package interconnects 617 and the plurality of package interconnects 227.

The second package 902 may include a fan out wafer level package (FOWLP). The second package 902 includes a second redistribution portion 920, a second die 921, and a second encapsulation layer 926. The second redistribution portion 920 may be a fan out portion (e.g. for fanning or routing of signaling to and from devices with different I/O pitches).

The second redistribution portion 920 includes at least one dielectric layer 922, at least one redistribution layer 925, and at least one underbump metallization (UBM) layer 929. A redistribution layer (e.g. 925) may redistribute signaling from I/O pads of a die to other parts of the package. The at least one redistribution layer 925 is coupled to the at least one UBM layer 929. The at least one UBM layer 929 is coupled to the plurality of package interconnects 227 (e.g., solder ball). In some implementations, the at least one UBM layer 929 may be optional. In such instances, the plurality of package interconnects 227 may be coupled to the at least one redistribution layer 925.

The second die 921 may be an integrated circuit (IC) that includes a plurality of transistors and/or other electronic components. The second die 921 may be a logic die and/or a memory die. The second die 921 may be a bare die. The second die 921 may include the pad 923. The second die 921 is coupled to the second redistribution portion 920. In particular, the pad 923 of the second die 921 is coupled to the at least one redistribution layer 925.

The second encapsulation layer 926 at least partially encapsulates the second die 921. The second encapsulation layer 926 is coupled to the second redistribution portion 920. Different implementations may use different materials for the second encapsulation layer 926. For example, the second encapsulation layer 926 may include a mold and/or an epoxy fill.

Exemplary Package on Package (PoP) Device Comprising a Thermal Interface Material (TIM)

Figure 10:
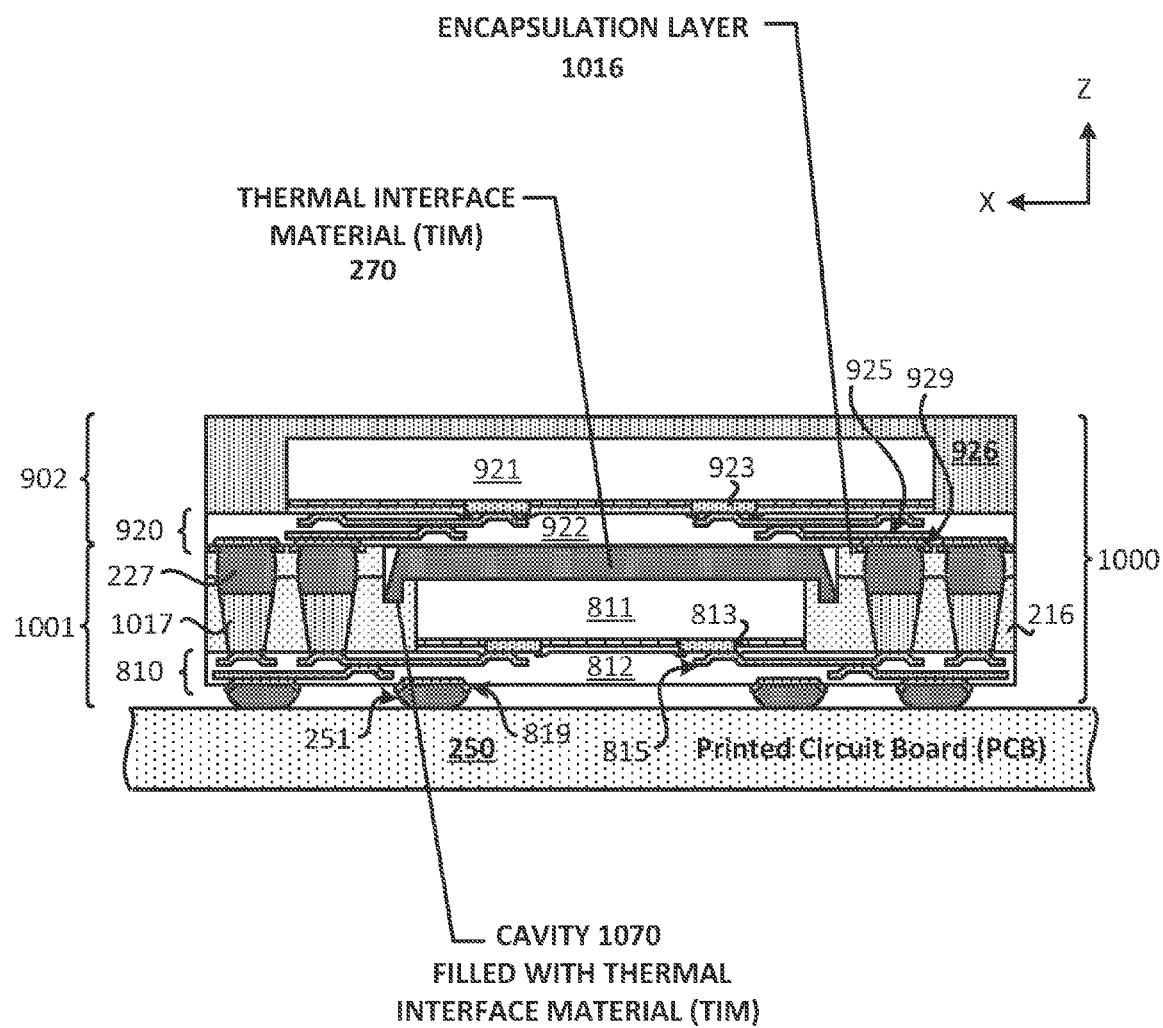
FIG. 10 illustrates a profile view of a package on package (PoP) device that includes a thermal interface material (TIM).

FIG. 10 illustrates another package on package (PoP) device 1000 that includes a first package 1001, the second package 902, and the thermal interface material (TIM) 270. The second package 902 is coupled to the first package 1001. The package on package (PoP) device 1000 is coupled to a printed circuit board (PCB) 250 through the plurality of solder balls 251. The package on package (PoP) device 1000 is similar to the package on package (PoP) device 900, except that the first package 1001 has a different configuration. In particular, the first package 1001 includes a wafer level package (WLP). Thus, the package on package (PoP) device 1000 of FIG. 10 includes two wafer level packages (WLPs).

In some implementations, the thermal interface material (TIM) 270 is located between the first package 1001 and the second package 902. In some implementations, the thermal interface material (TIM) 270 is located between an electronic package component (e.g., first die 811) of the first package 1001 and the second package 902.

The first package 1001 includes a cavity 1070 that is formed in the encapsulation layer 1016 (and in some implementations also the first encapsulation layer 216) such that the cavity is formed over the first die 811 and also laterally around the first die 811. As shown in FIG. 10, the thermal interface material (TIM) 270 is formed in the cavity 1070.

It is noted that the cavity 1070 may include one or more cavities formed in the encapsulation layer 1016 and/or the first encapsulation layer 216. For example, the cavity 1070 may include a first cavity located above the first die 811, and a second cavity located laterally around the first die 811.

The first package 1001 may include a fan out wafer level package (FOWLP). The first package 1001 includes the first redistribution portion 810, the first die 811, the first encapsulation layer 216, the encapsulation layer 816, and a plurality of interconnects 1017 (e.g., vias). The first redistribution portion 810 may be a fan out portion (e.g. for fanning or routing of signaling to and from devices with different I/O pitches). The first package 1001 may also include the plurality of package interconnects 227.

The first redistribution portion 810 includes at least one dielectric layer 812, at least one redistribution layer 815, and at least one underbump metallization (UBM) layer 819. A redistribution layer (e.g. 815) may redistribute signaling from I/O pads of a die to other parts of the package. The at least one redistribution layer 815 is coupled to the at least one UBM layer 819. The at least one UBM layer 819 is coupled to the plurality of solder balls 251. In some implementations, the at least one UBM layer 819 may be optional. In such instances, the plurality of solder balls 251 may be coupled to the at least one redistribution layer 815.

The first die 811 may be an integrated circuit (IC) that includes a plurality of transistors and/or other electronic components. The first die 811 may be a logic die and/or a memory die. The first die 811 may be a bare die. The first die 811 may include the pad 813. The first die 811 is coupled to the first redistribution portion 810. In particular, the pad 813 of the first die 811 is coupled to the at least one redistribution layer 815.

The plurality of interconnects 1017 at least partially passes through the encapsulation layer 816. The plurality of interconnects 1017 is coupled to the first redistribution portion 810. In particular, the plurality of interconnects 1017 is coupled to the at least one redistribution layer 815.

The encapsulation layer 816 at least partially encapsulates the first die 811 and the plurality of interconnects 1017. In some implementations, a surface of the encapsulation layer 816 may be substantially co-planar with a surface (e.g., back side surface) of the first die 811. The first encapsulation layer 216 is formed over the first die 811 and the encapsulation layer 816. The encapsulation layer 816 may be the same material or a different material as the first encapsulation layer 216. The first encapsulation layer 216 at least partially encapsulates the thermal interface material (TIM) 270 and the plurality of package interconnects 227 (e.g., solder balls). The first encapsulation layer 216 is optional.

The second package 902 may include a fan out wafer level package (FOWLP). The second package 902 includes the second redistribution portion 920, the second die 921, and the second encapsulation layer 926. The second redistribution portion 920 may be a fan out portion (e.g. for fanning or routing of signaling to and from devices with different I/O pitches).

The second package 902 is coupled to the first package 1001 through the plurality of package interconnects 227. The plurality of package interconnects 227 may include a solder interconnect (e.g., solder ball). The plurality of package interconnects 227 is coupled to the second redistribution portion 920 and the plurality of interconnects 1017 (e.g., vias) of the first package 1001. In particular, the plurality of package interconnects 227 is coupled to the UBM layer 929 and the plurality of interconnects 1017 (e.g., vias) of the first package 1001. In some implementations, the plurality of package interconnects 227 is coupled to the redistribution layer 925 and the plurality of interconnects 1017 (e.g., vias) of the first package 1001.

The thermal interface material (TIM) 270 is located over the first die 811 (e.g., over back side of the first die 811). In particular, the thermal interface material (TIM) 270 is located between the first die 811 of the first package 1001, and the second redistribution portion 920 of the second package 902. Having described various examples of package on package (PoP) devices that include a thermal interface material (TIM), various processes and methods for fabricating a package on package (PoP) device that includes a thermal interface material (TIM) will now be described.

The disclosure describes a thermal interface material (TIM) 270 being provided between the first package and the second package. However, in some implementations, other materials may be used separately or in combination with the thermal interface material (TIM) 270. For example, a bonding material or protective material may be provided between packages. Such material may be used to help bond the bottom package to the top package and provide a stronger mechanical bond between the two packages. Examples of materials that may be provided include epoxy and/or underfill. In some implementations, the cavity (e.g., cavity 370, cavity 570, cavity 670, cavity 770, cavity 870, cavity 970, cavity 1070) may include combinations of several materials, including for example, the thermal interface material (TIM) 270, bonding material, protective material, epoxy, underfill, and combination thereof.

Exemplary Sequence for Fabricating a Package Comprising a Thermal Interface Material (TIM)

Figure 11A:
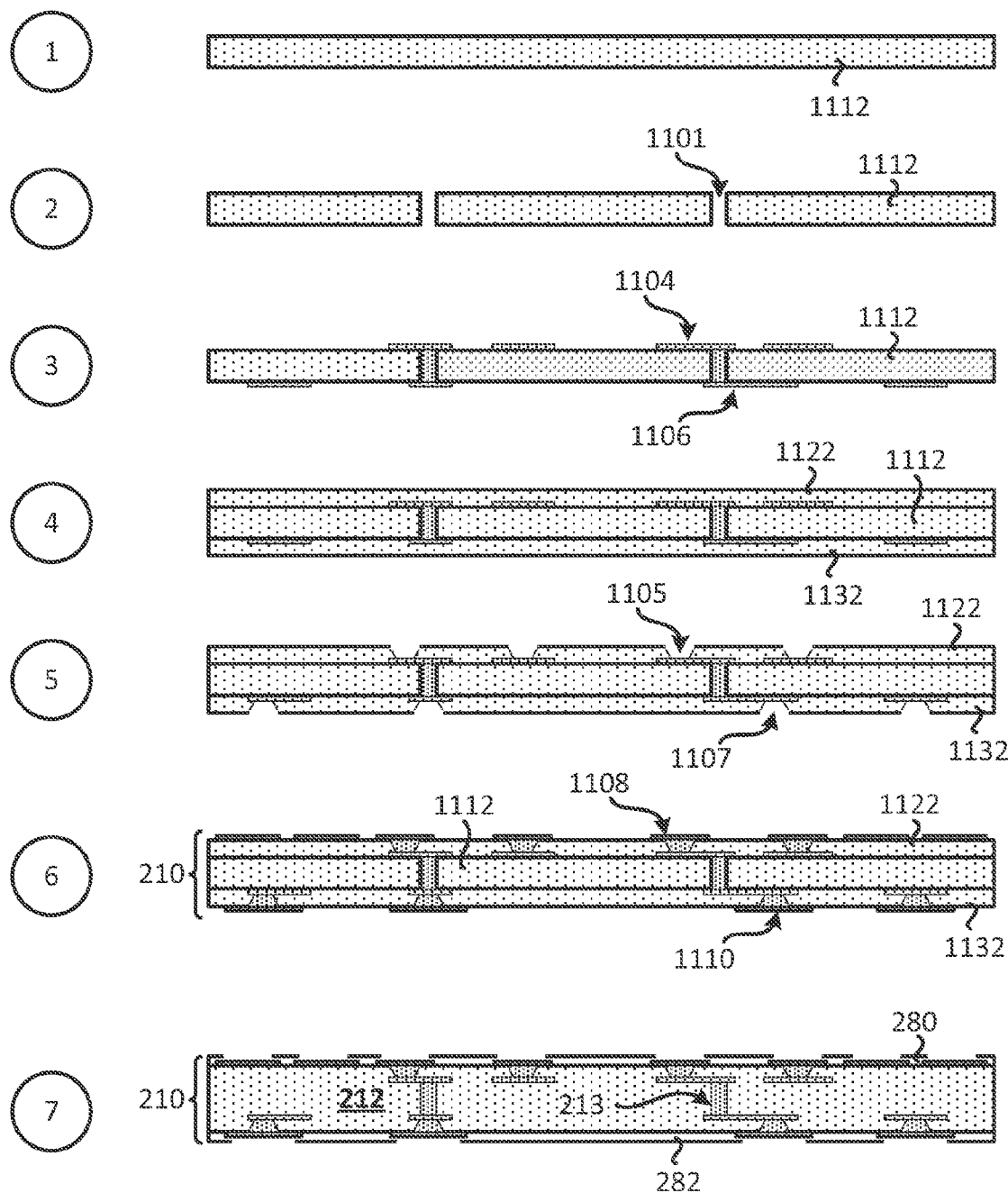
FIG. 11 (which includes FIGS. 11A-11C) illustrates an example of a sequence for fabricating a package that includes a thermal interface material (TIM).
Figure 11B:
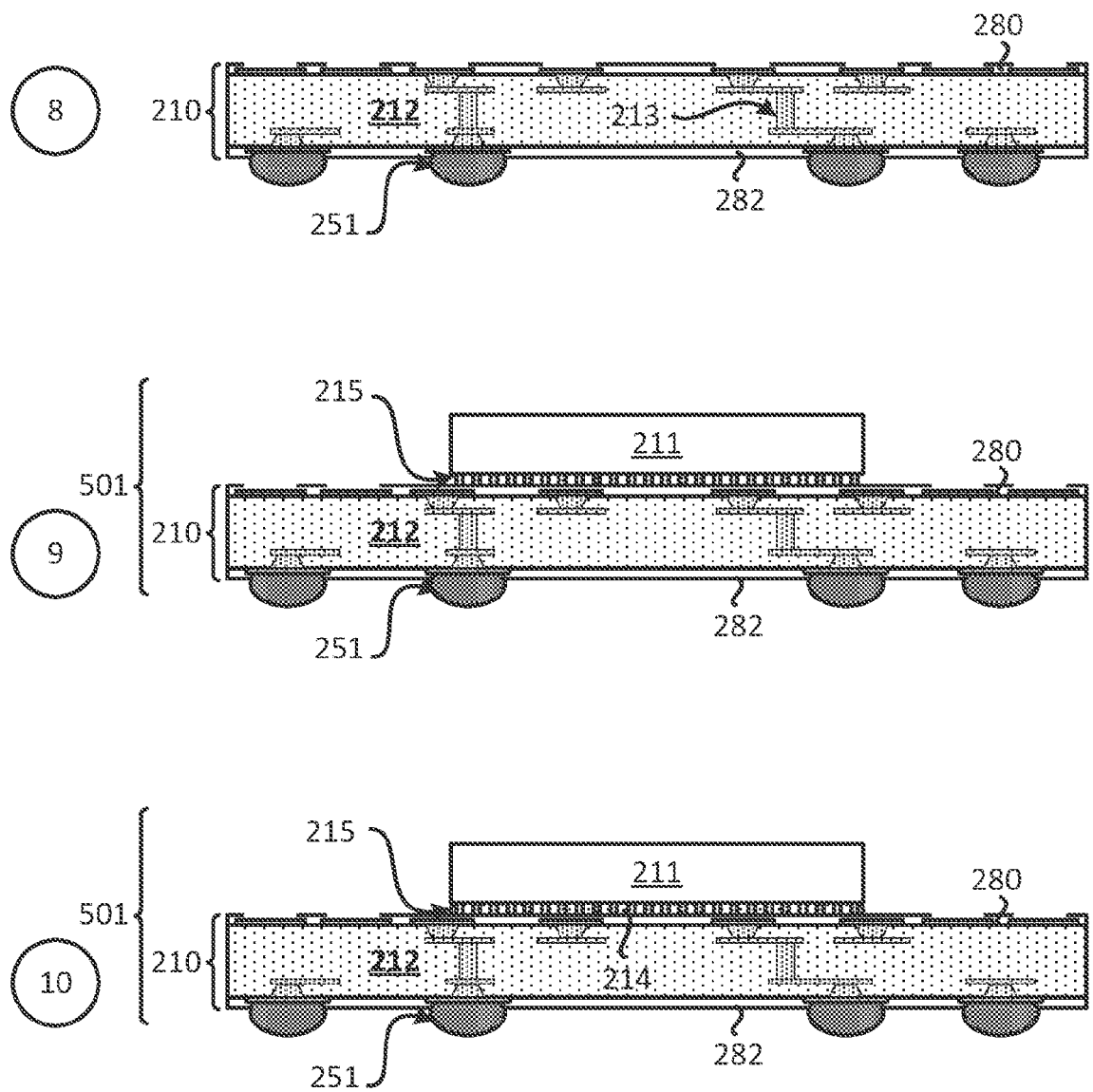
Figure 11C:
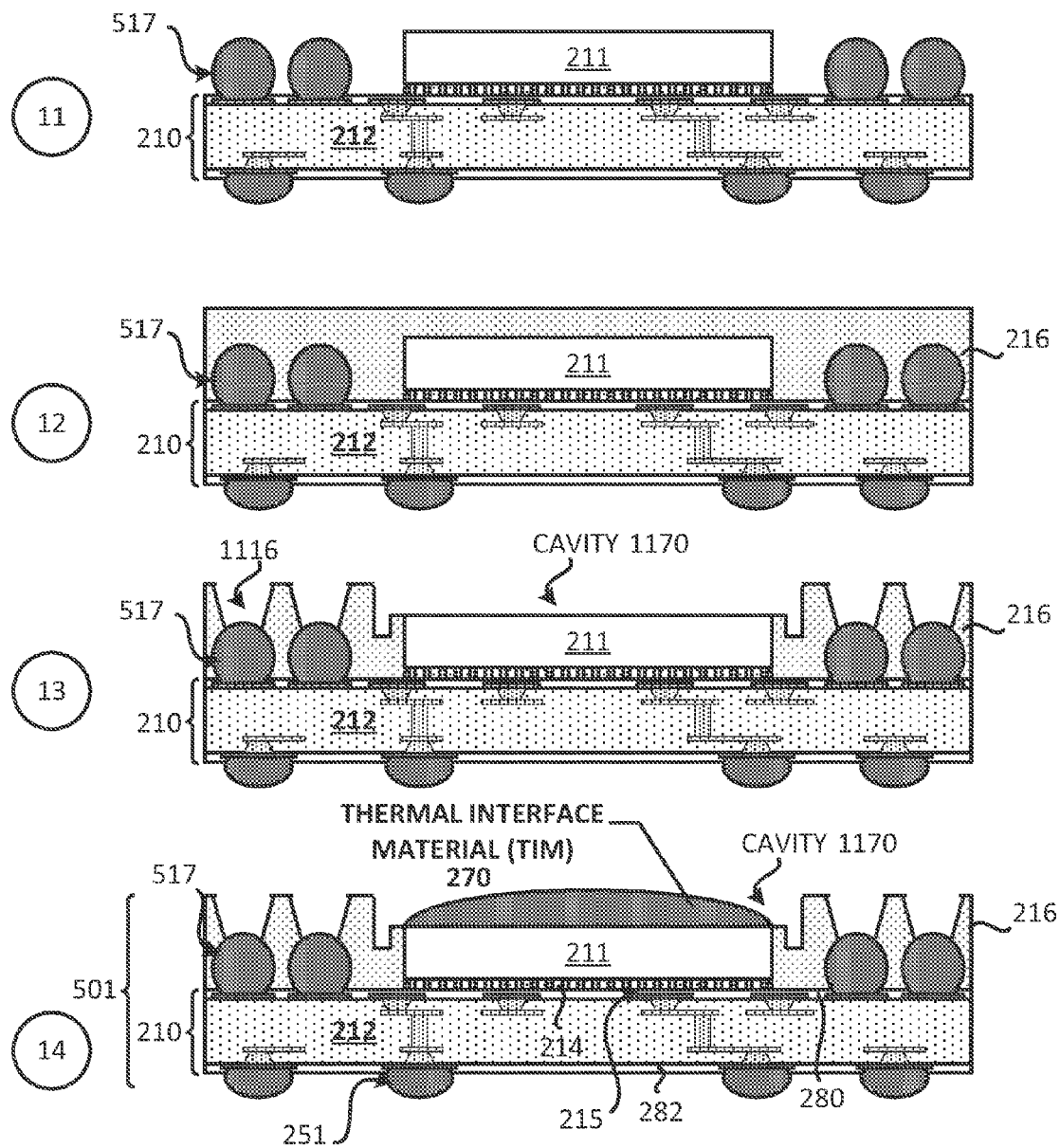

In some implementations, providing/fabricating a package that includes a thermal interface material (TIM) includes several processes. FIG. 11 (which includes FIGS. 11A-11C) illustrates an exemplary sequence for providing/fabricating a package that includes a thermal interface material (TIM). In some implementations, the sequence of FIGS. 11A-11C may be used to fabricate the package (e.g., integrated circuit (IC) package) that includes a thermal interface material (TIM) of FIGS. 2-10 and/or other packages described in the present disclosure. However, for the purpose of simplification, FIGS. 11A-11C will be described in the context of fabricating a package of FIG. 5. In particular, FIGS. 11A-11C will be described in the context of fabricating the first package 501 of FIG. 5.

It should be noted that the sequence of FIGS. 11A-11C may combine one or more stages in order to simplify and/or clarify the sequence for providing a package. In some implementations, the order of the processes may be changed or modified.

Stage 1, as shown in FIG. 11A, illustrates a state after a first dielectric layer 1112 is provided. The first dielectric layer 1112 may be a core layer. The first dielectric layer 1112 may be formed or provided by a supplier.

Stage 2 illustrates a state after at least one cavity 1101 is formed in the first dielectric layer 1112. Different implementations may form the cavity 1101 in the first dielectric layer 1112. A laser process and/or a photo-lithography process may be used to form the cavity 1101.

Stage 3 illustrates a state a first metal layer 1104 and a second metal layer 1106 are formed on and/or in the first dielectric layer 1112. The first metal layer 1104 and the second metal layer 1106 may represent the plurality of first interconnects 213, as described above in at least FIG. 5.

Stage 4 illustrates a state after a second dielectric layer 1122 and a third dielectric layer 1132 are formed on the first dielectric layer 1112.

Stage 5 illustrates a state after at least one cavity 1105 is formed in the second dielectric layer 1122, and at least one cavity 1107 is formed in the third dielectric layer 1132. Different implementations may form the cavity 1105 in the second dielectric layer 1122 and the cavity 1107 in the third dielectric layer 1132. A laser process and/or a photo-lithography process may be used to form the cavity 1105 and/or the cavity 1107.

Stage 6 illustrates a state a third metal layer 1108 is formed on and/or in the second dielectric layer 1122, a fourth metal layer 1110 is formed on and/or in the third dielectric layer 1132. The third metal layer 1108 and the fourth metal layer 1110 may represent the plurality of first interconnects 213, as described above in at least FIG. 5. Stage 6 may represent a package substrate (e.g., first package substrate 210) that includes at least one dielectric layer and a plurality of first interconnects.

Stage 7 illustrates a state after a first solder resist layer 280 is formed over the dielectric layer 212, and a second solder resist layer 282 is formed over the dielectric layer 212. The dielectric layer 212 may collectively represent the first dielectric layer 1112, the second dielectric layer 1122, and the third dielectric layer 1132. Stage 7 may represent a package substrate (e.g., first package substrate 210) that includes the dielectric layer 212, the plurality of first interconnects 213, the first solder resist layer 280, and the second solder resist layer 282.

Stage 8, as shown in FIG. 11B, illustrates a state after the plurality of solder balls 251 is coupled to the first package substrate 210. In particular, the plurality of solder balls 252 is coupled to the plurality of first interconnects 213.

Stage 9 illustrates a state after the first die 211 is coupled to the first package substrate 210, through the plurality of first interconnects 215. Different implementations may couple the first die 211 to the first package substrate 210 differently (e.g., by using interconnect pillars). In some implementations, a reflow process (e.g., chip attach reflow process) may be used to couple the first die 211 to the first package substrate 210. In some implementations, a reflux process may be used after the reflow process.

Stage 10 illustrates a state after a first underfill 214 is provided between the first die 211 and the first package substrate 210. The first underfill 214 may at least partially surround the plurality of first interconnects 215. In some implementations, providing the first underfill 214 includes an underfill dispense process.

Stage 11, as shown in FIG. 11C, illustrates a state after a plurality of package interconnects 517 is provided (e.g., formed) over the first package substrate 210. The plurality of package interconnects 517 may include a solder interconnect.

Stage 12 illustrates a state after an encapsulation layer 216 is at least partially formed over the first die 211, the first package substrate 210, and the plurality of package interconnects 517. In some implementations, the encapsulation layer 216 at least partially encapsulates the first die 211 and the plurality of package interconnects 517. In some implementations, the first die 211 is completely encapsulated by the encapsulation layer 216 and the encapsulation layer 216 is grinded down such that a top surface of the encapsulation layer 216 is substantially co-planar with a surface (e.g., back side surface) of the first die 211.

Stage 13 illustrates a state after at least one cavity 1116 and cavity 1170 are formed in the encapsulation layer 216. The cavity 1116 may be formed to at least partially expose the plurality of package interconnects 517. The cavity 1170 may be formed over the first die 211 and/or laterally with respect to the first die 211. A laser process and/or a photo-lithography process may be used to form the cavity 1116. In some implementations, the encapsulation layer 216 is photo-etchable encapsulation layer. That is, the photo-etchable encapsulation layer may be etched through a photo-lithography process. In some implementations, a photo-lithography process does less damage to the die and/or interconnects (e.g., pads of the substrate) than a laser process. Moreover, a photo-lithography process produces more accurate and precise cavities than a laser process, which means that the cavities can be formed closer to the die. This in turn, can result in smaller packages and/or package on package (PoP) devices (e.g., packages with smaller surface areas). It is noted that any of the encapsulation layers (e.g., encapsulation layer 816) described in the present disclosure may be a photo-etchable encapsulation layer.

Stage 14 illustrates a state after the thermal interface material (TIM) 270 is provided (e.g., dispensed) over the first die 211 (e.g., to the back side surface of the first die 211). Stage 14 illustrates in some implementations, a first package 501 that includes a first package substrate 210, a first die 211, a plurality of package interconnects 517, an encapsulation layer 216, and the thermal interface material (TIM) 270. In some implementations, after the thermal interface material (TIM) 270 is provided, portions of the thermal interface material (TIM) 270 may flow into portions of the cavity 1170 that is located laterally with respect to the first die 211. In some implementations, a curing process may be performed to cure the thermal interface material (TIM) 270.

In some implementations, several first packages are concurrently fabricated on a wafer, and a singulation process is performed to cut the wafer into individual packages.

Exemplary Sequence for Fabricating a Package Comprising a Thermal Interface Material (TIM)

Figure 12A:
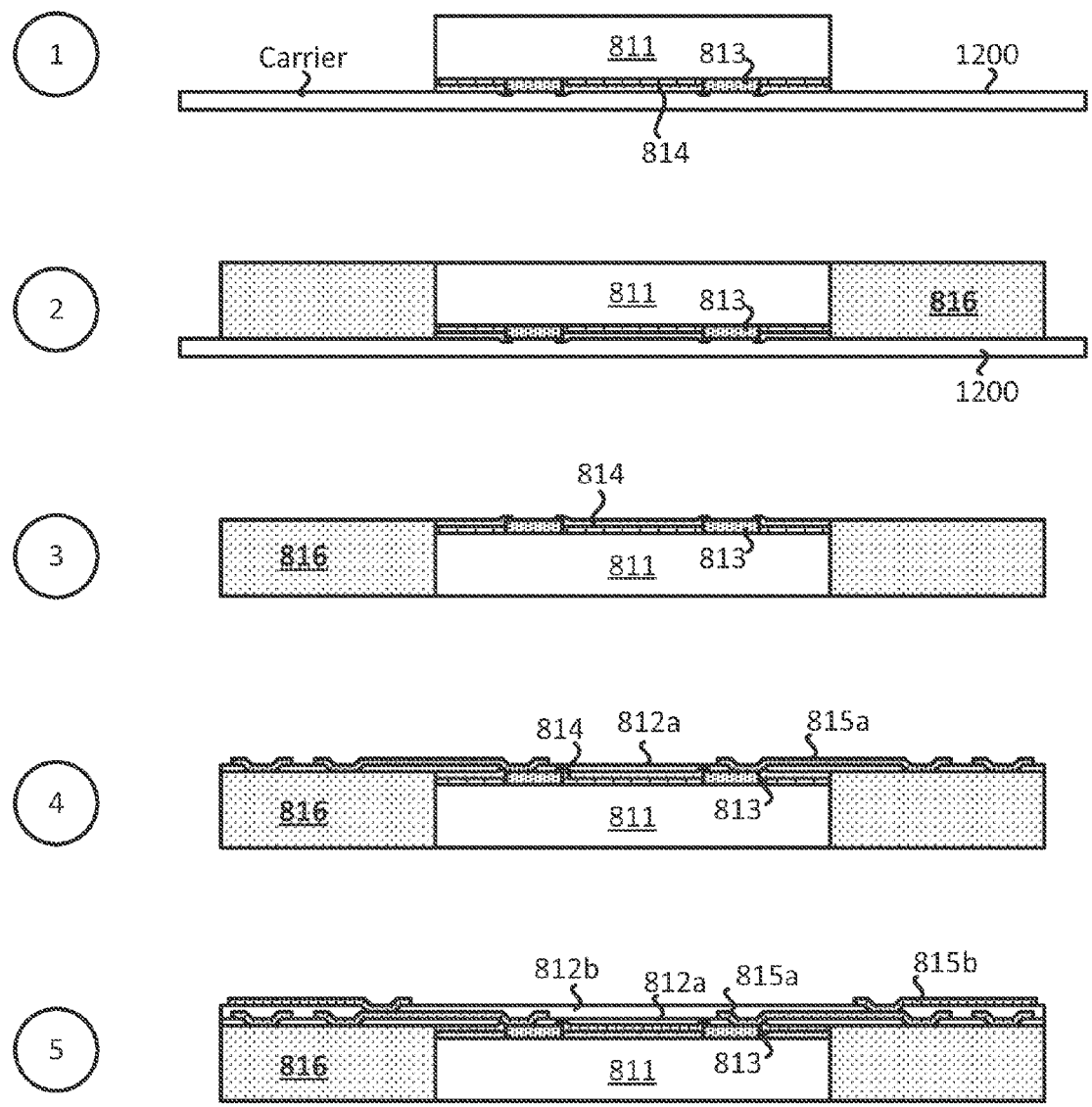
FIG. 12 (which includes FIGS. 12A-12B) illustrates an example of a sequence for fabricating a package that includes a thermal interface material (TIM).
Figure 12B:
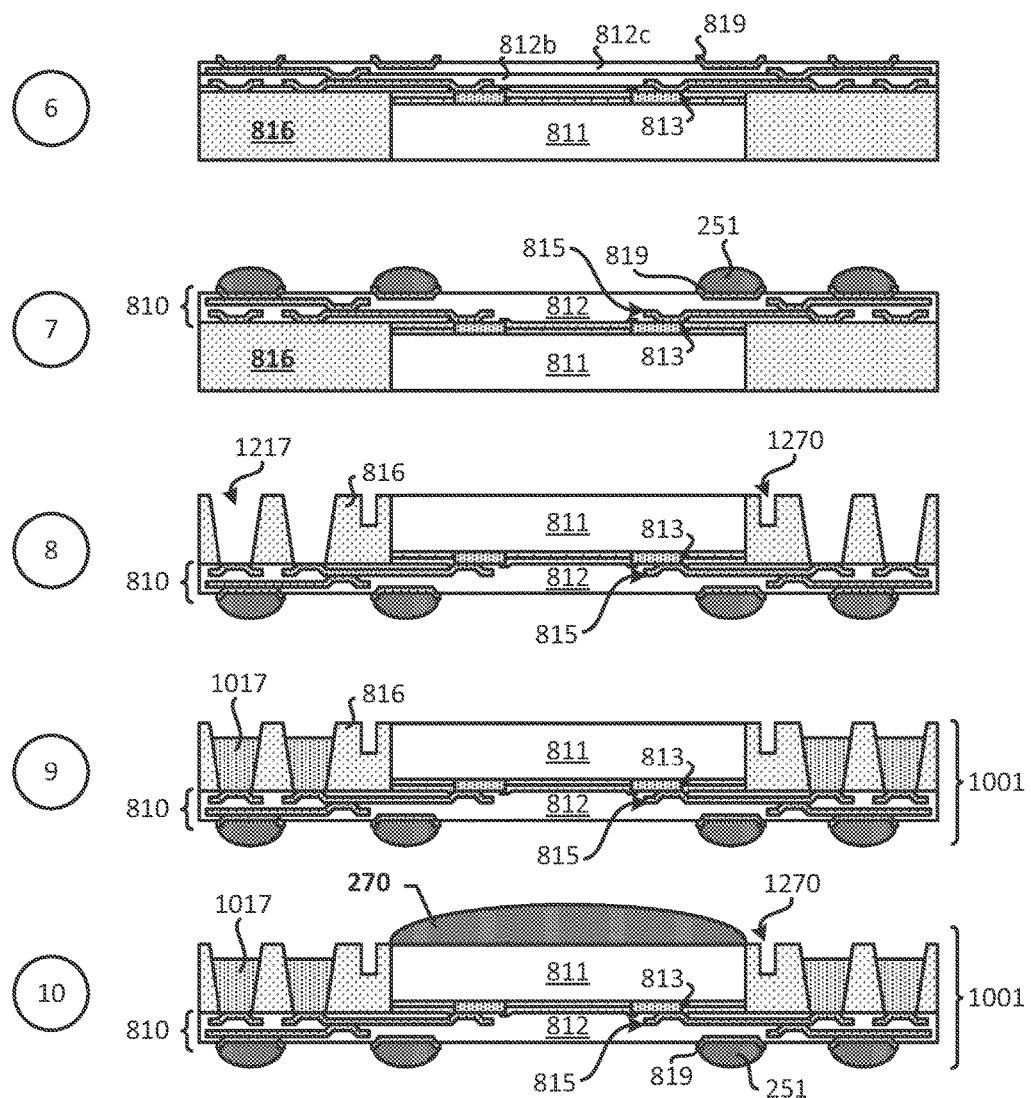

In some implementations, fabricating a package that includes a thermal interface material (TIM) includes several processes. FIG. 12 (which includes FIGS. 12A-12B) illustrates an exemplary sequence for providing/fabricating a package that includes a thermal interface material (TIM). In some implementations, the sequence of FIGS. 12A-12B may be used to fabricate a package (e.g., integrated circuit (IC) package) that includes a thermal interface material (TIM) of FIGS. 7-10 and/or other packages described in the present disclosure. However, for the purpose of simplification, FIGS. 12A-12B will be described in the context of providing/fabricating the package of FIG. 10. In particular, FIGS. 12A-12B will be described in the context of fabricating the first package 1001 of FIG. 10. FIGS. 12A-12B may be used to fabricate a fan out wafer level package (FOWLP).

It should be noted that the sequence of FIGS. 12A-12B may combine one or more stages in order to simplify and/or clarify the sequence for providing a package. In some implementations, the order of the processes may be changed or modified.

Stage 1, as shown in FIG. 12A, illustrates a state after a first die 811 is coupled to a carrier 1200. The first die 811 includes a pad 813 and at least one passivation layer 814. The carrier 1200 may be an adhesive tape layer.

Stage 2 illustrates a state after an encapsulation layer 816 is formed over the first die 811. The encapsulation layer 816 may at least partially encapsulate the first die 811. The encapsulation layer 816 is formed such that a surface of the encapsulation layer 816 is substantially co-planar with a back side surface of the first die 811. In some implementations, the encapsulation layer 816 may be formed differently around the first die 811. For example, the encapsulation layer 816 may be formed so that the encapsulation over molds the first die 811 (e.g., completely encapsulates the first die 811, and part of the encapsulation layer 816 may be removed during a later process).

Stage 3 illustrates a state after the first die 811 and the encapsulation layer 816 are decoupled (e.g., detached) from the carrier 1200.

Stage 4 illustrates a state after a first dielectric layer 812a and a first redistribution layer 815a are formed over the first die 811 and the encapsulation layer 816. The first dielectric layer 812a is formed over the passivation layer 814 of the first die 811. The first redistribution layer 815a is formed such that the first redistribution layer 815a is coupled to the pad 813 of the first die 811.

Stage 5 illustrates a state after a second dielectric layer 812b is formed over the first dielectric layer 812a and the first redistribution layer 815a. Stage 5 also illustrates a state after a second redistribution layer 815b is formed over and coupled to the first redistribution layer 815a. The first redistribution layer 815a and the second redistribution layer 815b may represent the redistribution layer 815.

Stage 6, as shown in FIG. 12B, illustrates a state after a third dielectric layer 812c is formed over the second dielectric layer 812b and the second redistribution layer 815b. Stage 6 also illustrates a state after a UBM layer 819 is formed over and coupled to the second redistribution layer 815b. The first dielectric layer 812a, the second dielectric layer 812b and the third dielectric layer 812c may represent the dielectric layer 812.

Stage 7 illustrates a state after a plurality of solder balls 251 is coupled to the UBM layer 819. In some implementations, the UBM layer 819 may be optional. In such instances, the plurality of solder balls 851 may be coupled to the redistribution layer 815.

Stage 8 illustrates a state after at least one cavity 1217 and the cavity 1270 are formed in the encapsulation layer 816. Different implementations may form the cavity 1217 in the encapsulation layer 816 differently. A laser process and/or a photo-lithography process may be used to form the cavity 1217 and/or the cavity 1270. Stage 8 illustrates a first redistribution portion 810 that includes the dielectric layer 812, the redistribution layer 815 and the UBM layer 819. In some implementations, the encapsulation layer 816 may be overmolded over the first die 811. In such instances, the cavity 1270 may also be formed over the first die 811. That is, a portion of the encapsulation layer 816 that is over the first die 811 may be removed to form the cavity 1270 or a separate cavity.

Stage 9 illustrates a state after a plurality of interconnects 1017 is formed in the cavity 1217 of the encapsulation layer

816. The plurality of interconnects 1017 may include a via. A plating process may be used to form the plurality of interconnects 1017.

Stage 10 illustrates a state after at the thermal interface material (TIM) 270 is provided (e.g., dispensed) over the first die 811 (e.g., to the back side surface of the first die 811). Stage 10 illustrates in some implementations, a first package 1001 that includes the first redistribution portion 810, the first die 811, the encapsulation layer 816, the plurality of interconnects 1017, and the thermal interface material (TIM) 270. In some implementations, after the thermal interface material (TIM) 270 is provided, portions of the thermal interface material (TIM) 270 may flow into portions of the cavity 1270 that is located laterally with respect to the first die 811. In some implementations, a curing process (e.g., reflow process) may be performed to cure the thermal interface material (TIM) 270. In some implementations, other materials may flow into the cavity 1270. For example, a bonding material or protective material may be flow into or be provided in the cavity 1270. Such material may be used to help bond the bottom package to the top package and provide a stronger mechanical bond between the two packages. Examples of materials that may be provided include epoxy and/or underfill. In some implementations, the cavity 1270 may include combinations of several materials, including for example, the thermal interface material (TIM) 270, bonding material, protective material, epoxy, underfill, and combination thereof. It is noted that the cavity 1270 may be formed along different portions of the encapsulation layer 816 (e.g., along outer periphery of the encapsulation layer 816).

In some implementations, several first packages are concurrently fabricated on a wafer, and a singulation process is performed to cut the wafer into individual packages.

Exemplary Method for Fabricating a Package on Package (PoP) Device Comprising a Thermal Interface Material (TIM)

Figure 13:
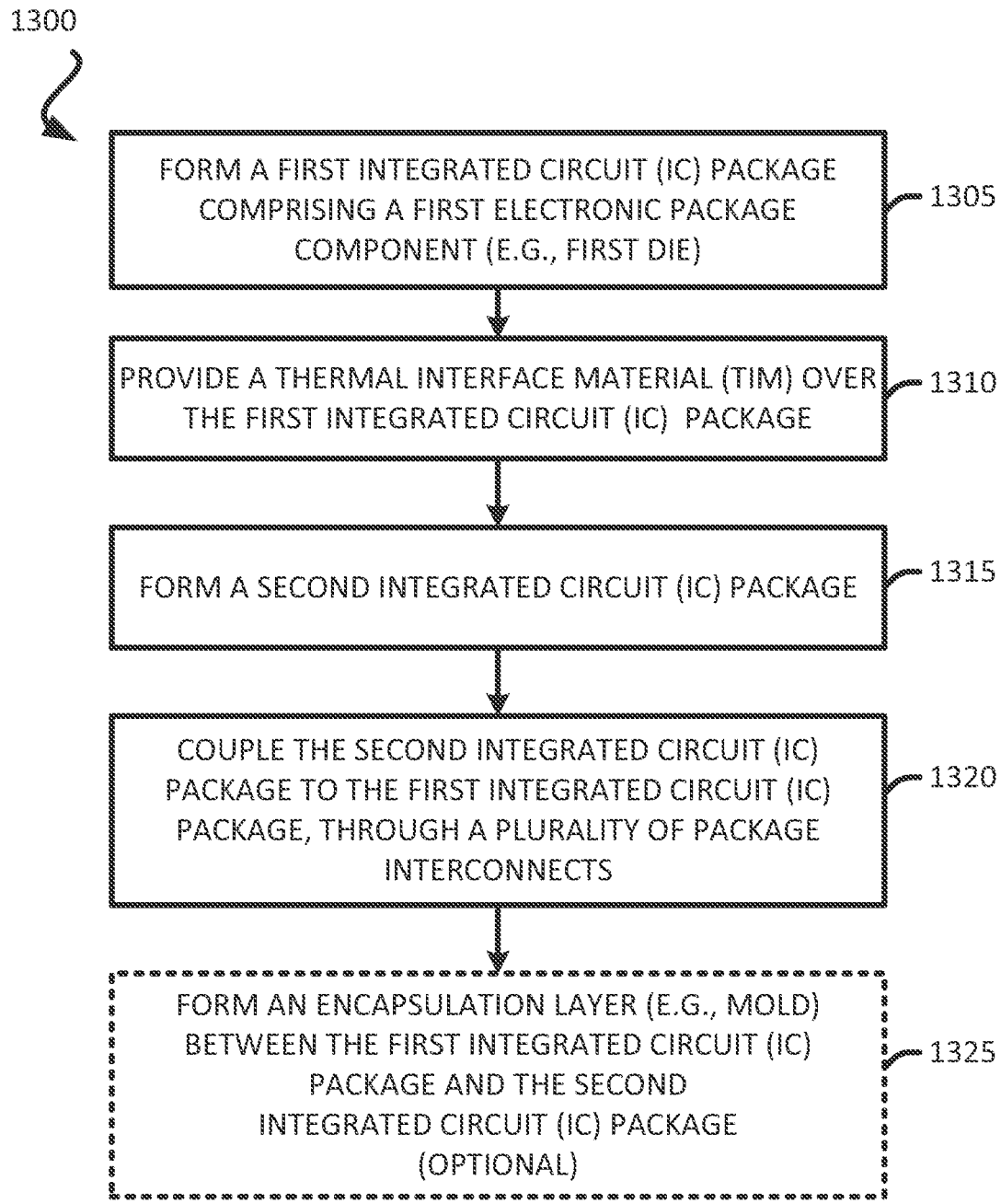
FIG. 13 illustrates a flow diagram of an exemplary method for fabricating a package on package (PoP) device that includes a thermal interface material (TIM).

In some implementations, providing/fabricating a package on package (PoP) that includes a thermal interface material (TIM) includes several processes. FIG. 13 illustrates an exemplary flow diagram of a method for providing/fabricating package on package (PoP) that includes a thermal interface material (TIM). In some implementations, the method of FIG. 13 may be used to provide/fabricate the package on package (PoP) that includes a thermal interface material (TIM) of FIGS. 2-10 and/or other package on package (PoP) devices described in the present disclosure. However, for the purpose of simplification, FIG. 13 will be described in the context of providing/fabricating the device package of FIG. 2.

It should be noted that the flow diagram of FIG. 13 may combine one or more processes in order to simplify and/or clarify the method for providing a package on package (PoP) device. In some implementations, the order of the processes may be changed or modified.

The method forms (at 1305) a first integrated circuit (IC) package that includes a first electronic package component (e.g., first die). Examples of forming a first integrated circuit (IC) package are illustrated and described in FIGS. 11A-11C and 12A-12B. In some implementations, the first integrated circuit (IC) package may include a fan out wafer level package (FOWLP). The first integrated circuit (IC) package may include a package substrate or a redistribution portion. The first integrated circuit (IC) package may include an encapsulation layer. Examples of a first package (e.g., first integrated circuit (IC) package) include the first package 201, the first package 601, the first package 701, the first package 801, and the first package 1001.

The method provides (at 1310) a thermal interface material (TIM) over the first integrated circuit (IC) package. The thermal interface material (TIM) may be provided and coupled to the first die (e.g., on or about a center of the back side surface of the first die 211).

The method forms (at 1315) a second integrated circuit (IC) package that includes a second die. Examples of forming a second integrated circuit (IC) package are illustrated and described in FIGS. 11A-11C and 12A-12B. In some implementations, the second integrated circuit (IC) package may include a fan out wafer level package (FOWLP). The second integrated circuit (IC) package may include a package substrate or a redistribution portion. The second integrated circuit (IC) package may include an encapsulation layer. Examples of a second package (e.g., second integrated circuit (IC) package) include the second package 202 and the second package 902.

The method couples (at 1320) the second integrated circuit (IC) package to the first integrated circuit (IC) package through a plurality of package interconnects (e.g., plurality of package interconnects 227).

The method optionally forms (at 1325) a first encapsulation layer between the first integrated circuit (IC) package and the second integrated circuit (IC) package. In particular, the first encapsulation layer (e.g., first encapsulation layer 216) is formed between the first die of a first package and the second package (e.g., second package substrate of the second package, second redistribution portion of the second package).

Exemplary Package on Package (PoP) Device Comprising a Thermal Interface Material (TIM)

Figure 14:
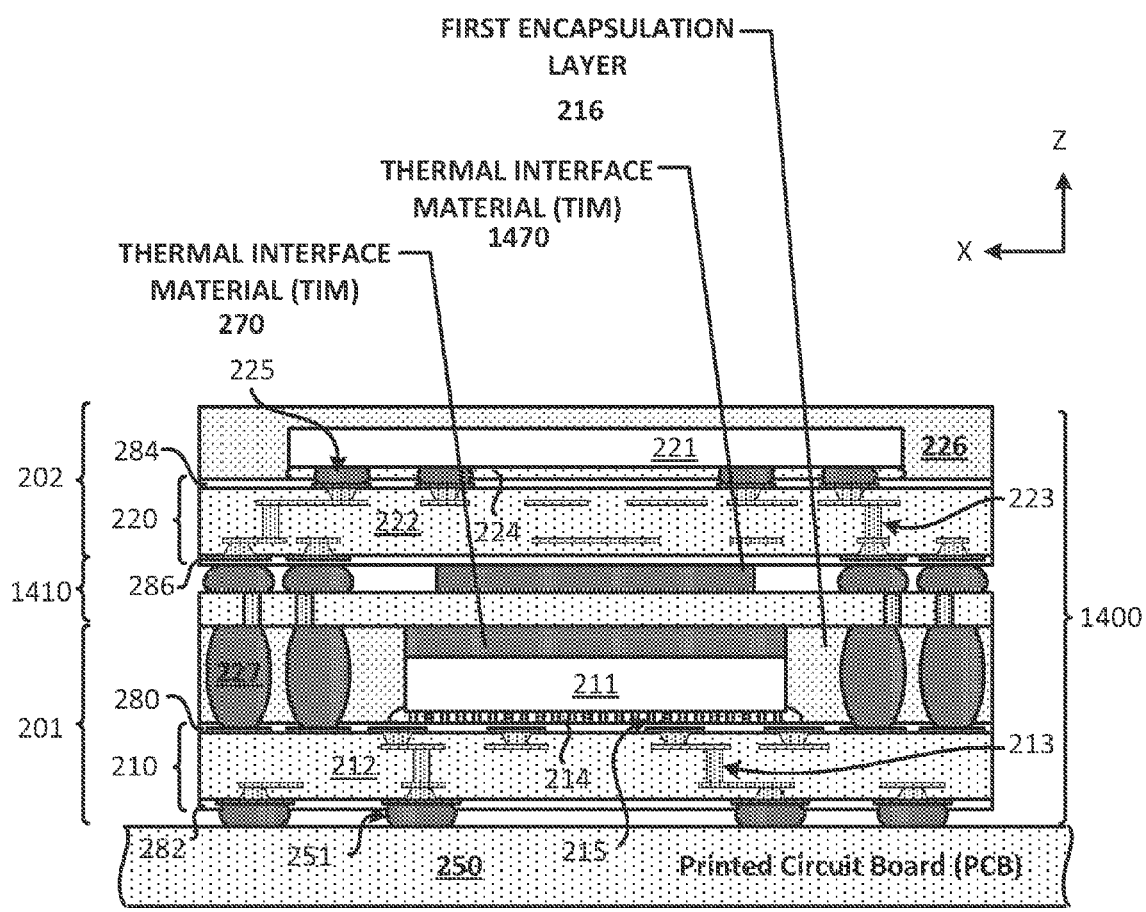
FIG. 14 illustrates a profile view of a package on package (PoP) device that includes a thermal interface material (TIM).

FIG. 14 illustrates a package on package (PoP) device 1400 that includes a first package 201, a second package 202, and a thermal interface material (TIM) 270, an interposer 1410, and a second thermal interface material (TIM) 1470.

The package on package (PoP) device 1400 is similar to the package on package (PoP) device 200, except that the package on package (PoP) device 1400 includes the interposer 1410 an a second thermal interface material (TIM) 1470.

As shown in FIG. 14, the first package 201 is coupled to the interposer 1410 (which includes a substrate and a plurality of interconnects). The interposer 1410 is coupled to the second package 202. The thermal interface material (TIM) 270 is located between the first package 201 and the interposer 1410. The thermal interface material (TIM) 1470 is located between the second package 202 and the interposer 1410.

Exemplary Cavities for Thermal Interface Material (TIM)

Figure 15:
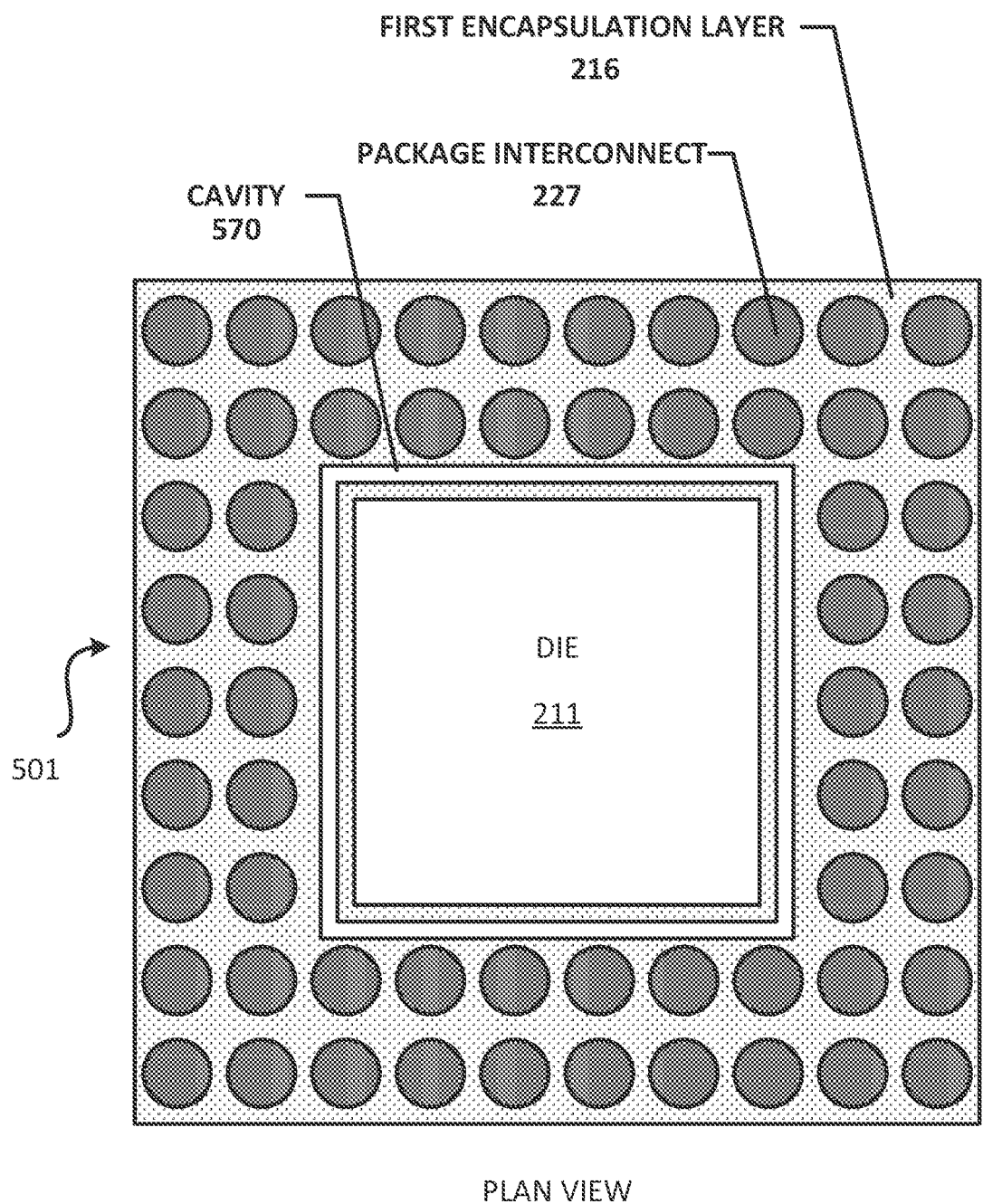
FIG. 15 illustrates a plan view of a package that includes a contiguous cavity in an encapsulation layer, where the cavity is for a thermal interface material (TIM).
Figure 16:
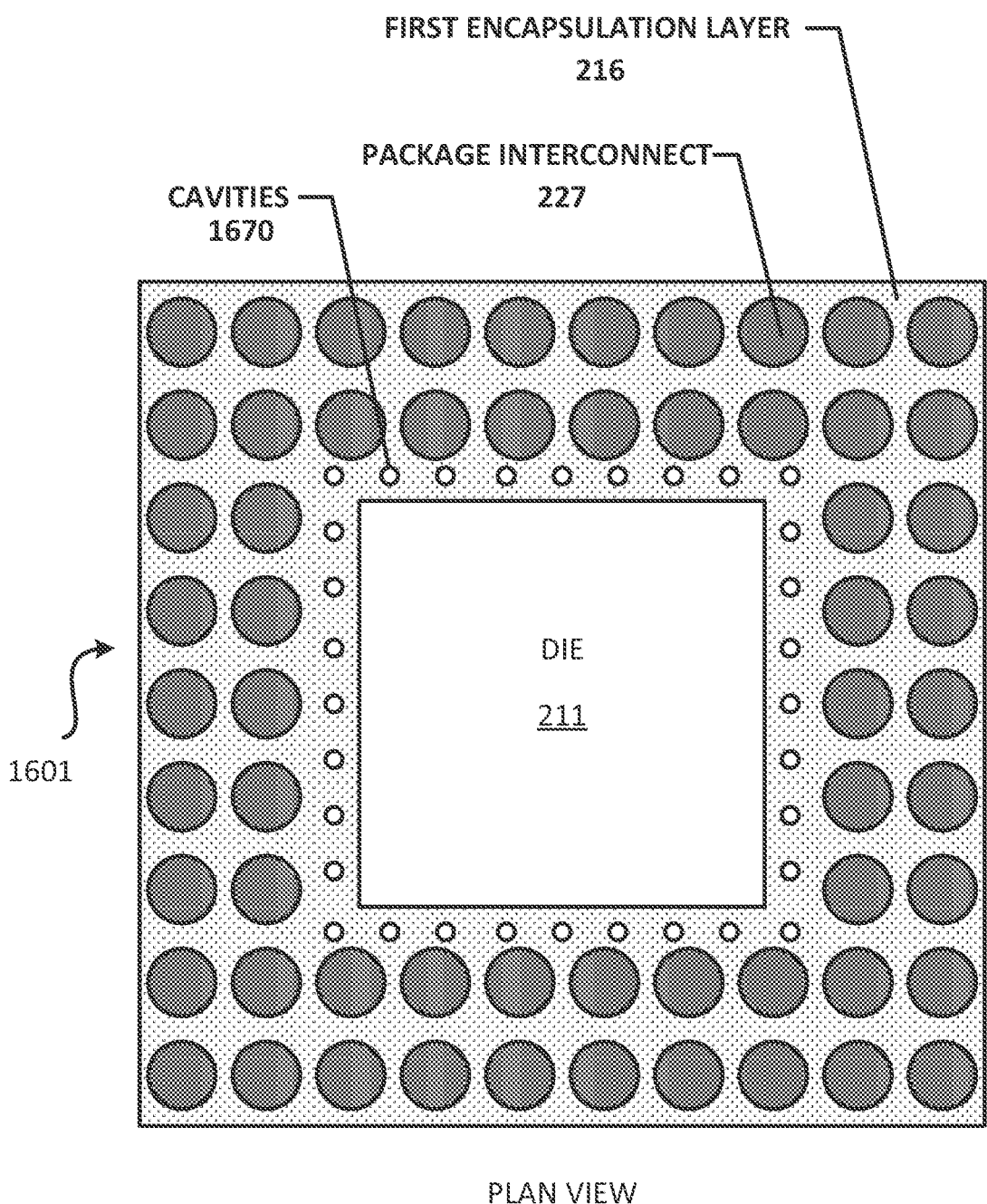
FIG. 16 illustrates a plan view of a package that includes a plurality of cavities in an encapsulation layer, where the cavities are for a thermal interface material (TIM).

Different implementations may use form different cavities in the encapsulation layer of a package. FIGS. 15 and 16 illustrate examples of different implementations of one or more cavities in an encapsulation layer, where the one or more cavities may be configured to catch overflow thermal interface material (TIM). In some implementations, the cavity may be one contiguous cavity. In some implementations, several cavities (e.g., several holes) are formed in the encapsulation layer so as to at least partially laterally surround a die. These examples are further described below.

FIG. 15 illustrates a plan view of the first package 501 through the cross section AA of FIG. 5. The first package 501 includes the first die 211, the first encapsulation layer 216, the plurality of package interconnects 227, and the cavity 570. As shown in FIG. 15, the cavity 570 is one contiguous cavity in the encapsulation layer 216. The cavity 570 laterally surrounds the first die 211. In some implementations, the cavity 570 may fully laterally surround the first die 211. In some implementations, the cavity 570 may partially laterally surround the first die 211.

FIG. 16 illustrates a plan view of the first package 1601. The first package 1601 may be similar to the first package 501 of FIG. 5, except that a different cavity is formed laterally around the first die 211. In some implementations, the plan view is through a cross section that is similar to the cross section AA of FIG. 5. The first package 1601 includes the first die 211, the first encapsulation layer 216, the plurality of package interconnects 227, and the plurality of cavities 1670. As shown in FIG. 16, the plurality of cavities 1670 comprises several cavities in the encapsulation layer 216, that at least partially laterally surround the first die 211. In some implementations, the plurality of cavities 1670 may fully laterally surround the first die 211.

The cavity 570 and the plurality of cavities 1670 may be configured to capture or store a thermal interface material (TIM). It is noted that the use of a contiguous cavity or a plurality of cavities as described above in FIGS. 15 and 16, may be implemented in any of the packages and package on package (PoP) devices described in the present application.

Moreover, the above described cavities (e.g., contiguous cavity, plurality of cavities) may be formed with the cavity that is formed over the first 211.

Exemplary Electronic Devices

Figure 17:
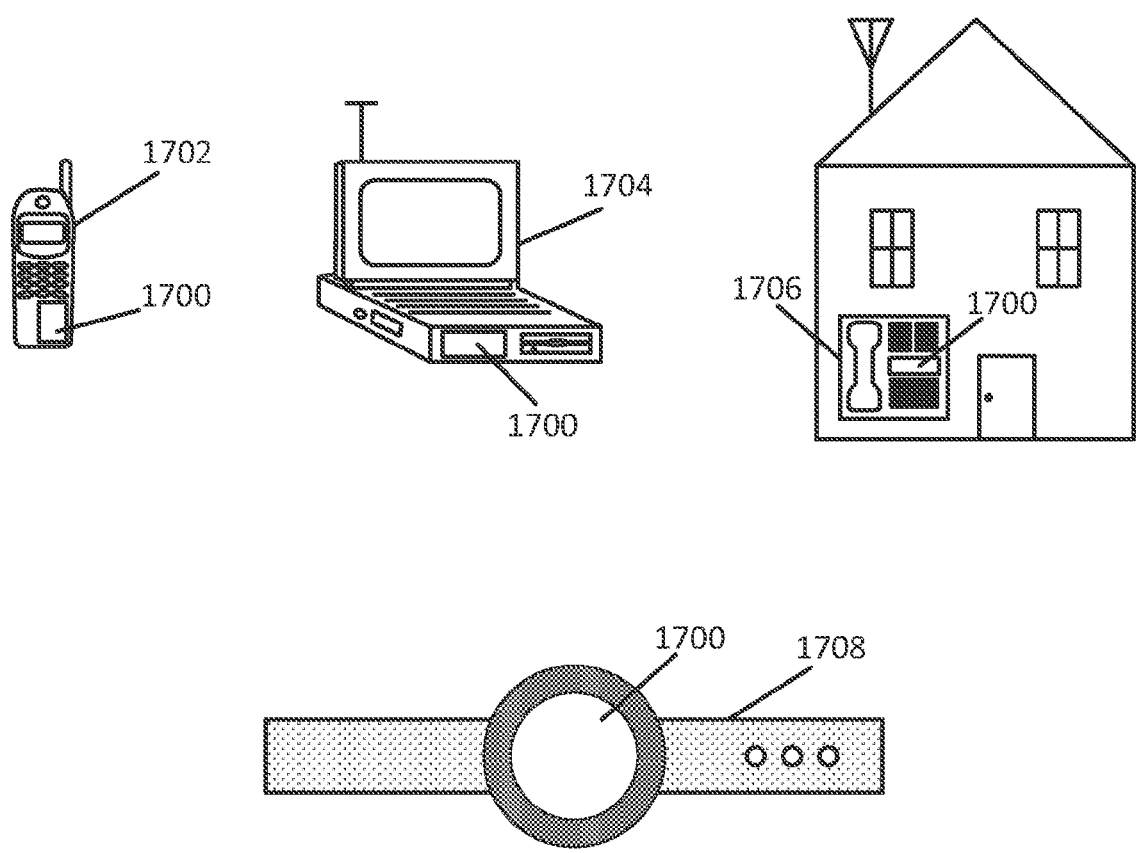
FIG. 17 illustrates various electronic devices that may include the various integrated devices, integrated device packages, semiconductor devices, dies, integrated circuits, and/or packages described herein.

FIG. 17 illustrates various electronic devices that may be integrated with any of the aforementioned integrated device, semiconductor device, integrated circuit, die, interposer, package or package-on-package (PoP). For example, a mobile phone device 1702, a laptop computer device 1704, a fixed location terminal device 1706, a wearable device 1708 may include an integrated device 1700 as described herein. The integrated device 1700 may be, for example, any of the integrated circuits, dies, integrated devices, integrated device packages, integrated circuit devices, device packages, integrated circuit (IC) packages, package-on-package devices described herein. The devices 1702, 1704, 1706, 1708 illustrated in FIG. 17 are merely exemplary. Other electronic devices may also feature the integrated device 1700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2, 3, 4, 5, 6, 7, 8, 9, 10, 11A-11C, 12A-12B, 13, 14, 15, 16 and/or 17 may be rearranged and/or combined into a single component, process, feature or function or embodied in several components, processes, or functions. Additional elements, components, processes, and/or functions may also be added without departing from the disclosure. It should also be noted that FIGS. 2, 3, 4, 5, 6, 7, 8, 9, 10, 11A-11C. 12A-12B, 13, 14, 15, 16 and/or 17 and its corresponding description in the present disclosure is not limited to dies and/or ICs. In some implementations, FIGS. 2, 3, 4, 5, 6, 7, 8, 9, 10, 11A-11C, 12A-12B, 13, 14, 15, 16 and/or 17 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package on package (PoP) device comprising:
a first package comprising:
a first substrate comprising a dielectric layer;
a first integrated device coupled to the first substrate; and
a first encapsulation layer that at least partially encapsulates the first integrated device, the first encapsulation layer in direct contact with a side wall of the first integrated device, wherein the first encapsulation layer comprises a first cavity located laterally with respect to the first integrated device;
a second package coupled to the first package; and
a thermal interface material (TIM) coupled to the first integrated device such that the thermal interface material (TIM) is formed between the first integrated device and the second package, wherein the thermal interface material (TIM) is formed in the first cavity of the first encapsulation layer,
wherein the thermal interface material (TIM) as a whole, comprises a viscosity of about 23,000 millipascal seconds (mPa·s) or lower,
wherein the thermal interface material (TIM) comprises a thermal conductivity value of about 1 W/m·K or greater.

2. The package on package (PoP) device of claim 1, wherein the first cavity is formed in the first encapsulation layer such that the first cavity is laterally formed around the first integrated device.

3. The package on package (PoP) device of claim 1, wherein the first cavity is configured to capture the thermal interface material (TIM) that overflows over the integrated device during a curing process of the thermal interface material (TIM).

4. The package on package (PoP) device of claim 1, wherein prior to the thermal interface material (TIM) being cured, the thermal interface material (TIM) comprises a viscosity of about 23,000 millipascal seconds (Pa·s) or lower, at 5 revolutions per minute (RPM).

5. The package on package (PoP) device of claim 1, wherein the thermal interface material (TIM) comprises a thermal conductivity value of about 1.4 W/m·K or greater.

6. The package on package (PoP) device of claim 1, wherein the first encapsulation layer comprises a photo-etchable encapsulation layer, wherein the photo-etchable encapsulation layer has a photo-etchable property.

7. The package on package (PoP) device of claim 1, wherein the first substrate comprises a first redistribution portion.

8. A package on package (PoP) device comprising:
a first package comprising:
  a first substrate comprising a dielectric layer;
  a first integrated device coupled to the first substrate; and
  a first encapsulation layer that at least partially encapsulates the first integrated device, the first encapsulation layer in direct contact with a side wall of the first integrated device, wherein the first encapsulation layer comprises a first cavity over the first integrated device;
a second package coupled to the first package; and
a thermal interface material (TIM) coupled to the first integrated device such that the thermal interface material (TIM) is formed between the first integrated device and the second package, wherein the thermal interface material (TIM) is formed in the first cavity of the first encapsulation layer,
wherein the thermal interface material (TIM) as a whole, comprises a viscosity of about 23,000 millipascal seconds (mPa·s) or lower,
wherein the thermal interface material (TIM) comprises a thermal conductivity value of about 1 W/m·K or greater.

9. The package on package (PoP) device of claim 8, wherein the first encapsulation layer comprises a second cavity that is located laterally with respect to the first integrated device, and wherein the thermal interface material (TIM) is also formed in the second cavity of the first encapsulation layer.

10. The package on package (PoP) device of claim 9, wherein the second cavity is formed in the first encapsulation layer such that the second cavity is laterally formed around the first integrated device.

11. The package on package (PoP) device of claim 9, wherein the second cavity is configured to capture the thermal interface material (TIM) that overflows from the first cavity during a curing process of the thermal interface material (TIM).

12. The package on package (PoP) device of claim 8, wherein the package on package (PoP) device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

13. The package on package (PoP) device of claim 8, wherein the first encapsulation layer comprises a photo-etchable encapsulation layer, wherein the photo-etchable encapsulation layer has a photo-etchable property.

14. The package on package (PoP) device of claim 8, wherein the first substrate comprises a first redistribution portion.

15. An apparatus comprising:
a first package comprising:
  a first redistribution portion comprising a dielectric layer;
  a first integrated device coupled to the first redistribution portion; and
  a first encapsulation layer that at least partially encapsulates the first integrated device, the first encapsulation layer in direct contact with a side wall of the first integrated device, wherein the first encapsulation layer comprises a first cavity located laterally with respect to the first integrated device;
a second package coupled to the first package; and
means for heat dissipation coupled to the first integrated device such that the means for heat dissipation is formed between the first integrated device and the second package, wherein the means for heat dissipation is formed in the first cavity of the first encapsulation layer,
wherein the means for heat dissipation as a whole, comprises a viscosity of about 23,000 millipascal seconds (Pa·s) or lower,
wherein the means for heat dissipation comprises a thermal conductivity value of about 1 W/m·K or greater.

16. The apparatus of claim 15, wherein the first cavity is formed in the first encapsulation layer such that the first cavity is laterally formed around the first integrated device.

17. The apparatus of claim 15, wherein the first cavity is configured to capture the means for heat dissipation that overflows over the integrated device during a curing process of the means for heat dissipation.

18. The apparatus of claim 15, wherein prior to the means for heat dissipation being cured, the means for heat dissipation comprises a viscosity of about 23,000 millipascal seconds (Pa·s) or lower, at 5 revolutions per minute (RPM).

19. The apparatus of claim 15, wherein the means for heat dissipation comprises a thermal conductivity value of about 1.4 W/m·K or greater.

20. An apparatus comprising:
a first package comprising:
  a first redistribution portion comprising a dielectric layer;
  a first integrated device coupled to the first redistribution portion; and
  a first encapsulation layer that at least partially encapsulates the first integrated device, the first encapsulation layer in direct contact with a side wall of the first integrated device, wherein the first encapsulation layer comprises a first cavity over the first integrated device;
a second package coupled to the first package; and
means for heat dissipation coupled to the first integrated device such that the means for heat dissipation is formed between the first integrated device and the second package, wherein the means for heat dissipation is formed in the first cavity of the first encapsulation layer, wherein the means for heat dissipation as a whole, comprises a viscosity of about 23,000 millipascal seconds (Pa·s) or lower, wherein the means for heat dissipation comprises a thermal conductivity value of about 1 W/m·K or greater.

21. The apparatus of claim 20, wherein the first encapsulation layer comprises a second cavity that is located laterally with respect to the first integrated device, and wherein the means for heat dissipation is also formed in the second cavity of the first encapsulation layer.

22. The apparatus of claim 21, wherein the second cavity is formed in the first encapsulation layer such that the second cavity is laterally formed around the first integrated device.

23. The apparatus of claim 21, wherein the second cavity is configured to capture the means for heat dissipation that overflows from the first cavity during a curing process of the means for heat dissipation.

24. The apparatus of claim 20, wherein the apparatus is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

25. A method for fabricating a package on package (PoP) device, comprising:
providing a first package, wherein providing the first package comprises:
providing a first substrate comprising a dielectric layer;
coupling a first integrated device to the first substrate;
forming a first encapsulation layer that at least partially encapsulates the first integrated device such that the first encapsulation layer is in direct contact with a side wall of the first integrated device; and
forming a first cavity in the first encapsulation layer such that the first cavity is located laterally with respect to the first integrated device;
coupling a second package to the first package; and
coupling a thermal interface material (TIM) to the first integrated device such that the thermal interface material (TIM) is formed between the first integrated device and the second package, wherein the thermal interface material (TIM) is formed in the first cavity of the first encapsulation layer,
wherein the thermal interface material (TIM) as a whole, comprises a viscosity of about 23,000 millipascal seconds (mPa·s) or lower,
wherein the thermal interface material (TIM) comprises a thermal conductivity value of about 1 W/m·K or greater.

26. The method of claim 25, wherein the first cavity is formed in the first encapsulation layer such that the first cavity is laterally formed around the first integrated device.

27. The method of claim 25, wherein the first cavity is configured to capture the thermal interface material (TIM) that overflows over the integrated device during a curing process of the thermal interface material (TIM).

28. The method of claim 25, wherein prior to the thermal interface material (TIM) being cured, the thermal interface material (TIM) comprises a viscosity of about 23,000 millipascal seconds (Pa·s) or lower, at 5 revolutions per minute (RPM).

29. The method of claim 25, wherein the thermal interface material (TIM) comprises a thermal conductivity value of about 1.4 W/m·K.

30. A method for fabricating a package on package (PoP) device, comprising:
providing a first package, wherein providing the first package comprises:
providing a first substrate comprising a dielectric layer;
coupling a first integrated device to the first substrate; and
forming a first encapsulation layer that at least partially encapsulates the first integrated device such that the first encapsulation layer is in direct contact with a side wall of the first integrated device; and
forming a first cavity in the first encapsulation layer, over the first integrated device;
coupling a second package to the first package; and
coupling a thermal interface material (TIM) to the first integrated device such that the thermal interface material (TIM) is formed between the first integrated device and the second package, wherein the thermal interface material (TIM) is formed in the first cavity of the first encapsulation layer,
wherein the thermal interface material (TIM) as a whole, comprises a viscosity of about 23,000 millipascal seconds (mPa·s) or lower,
wherein the thermal interface material (TIM) comprises a thermal conductivity value of about 1 W/m·K or greater.

31. The method of claim 30, wherein providing the first package comprising the first encapsulation layer comprises forming a second cavity in the first encapsulation layer such that the second cavity is located laterally with respect to the first integrated device, and wherein the thermal interface material (TIM) is also formed in the second cavity of the first encapsulation layer.

32. The method of claim 31, wherein the second cavity is formed in the first encapsulation layer such that the second cavity is laterally formed around the first integrated device.

33. The method of claim 31, wherein the second cavity is configured to capture the thermal interface material (TIM) that overflows from the first cavity during a curing process of the thermal interface material (TIM).

34. The method of claim 30, wherein the package on package (PoP) device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

* * * * *